US011131921B2

(12) United States Patent
Shoki et al.

(10) Patent No.: US 11,131,921 B2
(45) Date of Patent: *Sep. 28, 2021

(54) METHOD FOR MANUFACTURING REFLECTIVE MASK BLANK, AND METHOD FOR MANUFACTURING REFLECTIVE MASK

(71) Applicant: HOYA CORPORATION, Tokyo (JP)

(72) Inventors: Tsutomu Shoki, Tokyo (JP); Kazuhiro Hamamoto, Tokyo (JP); Yohei Ikebe, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 330 days.

This patent is subject to a terminal disclaimer.

(21) Appl. No.: 16/054,295

(22) Filed: Aug. 3, 2018

(65) Prior Publication Data

US 2018/0348628 A1    Dec. 6, 2018

Related U.S. Application Data

(62) Division of application No. 14/768,787, filed as application No. PCT/JP2014/053987 on Feb. 20, 2014, now Pat. No. 10,067,419.

(30) Foreign Application Priority Data

Feb. 22, 2013    (JP) .............................. JP2013-033408

(51) Int. Cl.
  *C23C 14/02*    (2006.01)
  *C23C 14/35*    (2006.01)
  (Continued)

(52) U.S. Cl.
  CPC .............. *G03F 1/84* (2013.01); *C23C 14/024* (2013.01); *C23C 14/35* (2013.01); *C23C 14/46* (2013.01);
  (Continued)

(58) Field of Classification Search
  CPC ....... C23C 14/024; C23C 14/35; C23C 14/46; G03F 1/24; G03F 1/38; G03F 1/84;
  (Continued)

(56) References Cited

U.S. PATENT DOCUMENTS 9,229,316 B2 *   1/2016   Shoki ................... G03F 1/80
9,323,141 B2 *   4/2016   Shoki ................... G03F 1/24
(Continued)

FOREIGN PATENT DOCUMENTS

JP    2003-151902 A    5/2003
JP    2003-248299 A    9/2003
(Continued)

OTHER PUBLICATIONS

KR10-2015-7025136, "Notification of Reason for Refusal" with machine translation, dated May 26, 2020, 20 pages.
(Continued)

*Primary Examiner* — Michael A Band
(74) *Attorney, Agent, or Firm* — Kilpatrick Townsend & Stockton LLP

(57) ABSTRACT

A method of manufacturing a reflective mask blank comprising a multilayer reflective film formed on a substrate so as to reflect EUV light; and a laminated film formed on the multilayer reflective film. The method includes the steps of depositing the multilayer reflective film on the substrate to form a multilayer reflective film formed substrate; carrying out defect inspection for the multilayer reflective film formed substrate; depositing the laminated film on the multilayer reflective film of the multilayer reflective film formed substrate; forming a fiducial mark for an upper portion of the laminated film to thereby form a reflective mask blank comprising the fiducial mark, the fiducial mark serving as a reference for a defect position in defect infor-
(Continued)

mation; and carrying out defect inspection of the reflective mask blank by using the fiducial mark as a reference.

12 Claims, 9 Drawing Sheets

(51) Int. Cl.
    *C23C 14/46*     (2006.01)
    *G03F 1/24*     (2012.01)
    *G03F 1/38*     (2012.01)
    *G03F 1/84*     (2012.01)
    *G06T 7/00*     (2017.01)

(52) U.S. Cl.
    CPC ............... *G03F 1/24* (2013.01); *G03F 1/38* (2013.01); *G06T 7/0004* (2013.01); *G06T 2207/30148* (2013.01); *G06T 2207/30204* (2013.01)

(58) Field of Classification Search
    CPC ........... G06T 7/004; G06T 2207/30148; G06T 2207/30204
    See application file for complete search history.

(56) References Cited

U.S. PATENT DOCUMENTS

| | | | | |
|---|---|---|---|---|
| 10,067,419 B2* | 9/2018 | Shoki | ........................ | G03F 1/84 |
| 10,126,641 B2* | 11/2018 | Shoki | ........................ | G03F 1/24 |
| 2003/0082460 A1 | 5/2003 | Stivers et al. | | |
| 2003/0184721 A1 | 10/2003 | Itoh | | |
| 2007/0178387 A1 | 8/2007 | Ishida et al. | | |
| 2010/0178597 A1 | 7/2010 | Ishida et al. | | |
| 2012/0019916 A1 | 1/2012 | Shoki | | |
| 2012/0260222 A1 | 10/2012 | Ishida et al. | | |
| 2013/0078555 A1 | 3/2013 | Orihara et al. | | |

FOREIGN PATENT DOCUMENTS

| | | |
|---|---|---|
| JP | 2009-251412 A | 10/2009 |
| JP | 2012038786 A | 2/2012 |
| JP | 2012-59984 A | 3/2012 |
| JP | 2014-44385 A | 3/2014 |
| KR | 20070011367 A | 1/2007 |
| TW | 200849332 A | 12/2008 |
| TW | 201107873 A | 3/2011 |
| TW | 201243487 A | 11/2012 |
| WO | 2013/118716 A1 | 8/2003 |
| WO | 2008/129914 A1 | 10/2008 |

OTHER PUBLICATIONS

International Search Report for PCT/JP2014/053987 dated Apr. 1, 2014.

* cited by examiner (a)

(b)

(c)

(d)

METHOD FOR MANUFACTURING REFLECTIVE MASK BLANK, AND METHOD FOR MANUFACTURING REFLECTIVE MASK

CROSS-REFERENCE TO RELATED APPLICATIONS

This application is a Divisional of U.S. application Ser. No. 14/768,787, filed Aug. 19, 2015, which is a National Stage of International Application No. PCT/JP2014/053987 filed Feb. 20, 2014, claiming priority based on Japanese Patent Application No. 2013-033408 filed Feb. 22, 2013, the contents of all of which are incorporated herein by reference in their entirety.

TECHNICAL FIELD

This invention relates to a method of manufacturing a reflective mask blank and a method of manufacturing a reflective mask for use in the manufacture of semiconductor devices or the like.

BACKGROUND ART

Generally, fine pattern formation is carried out by photolithography in manufacturing processes of a semiconductor device. A number of transfer masks called photomasks are normally used for this fine pattern formation. The transfer mask comprises generally a transparent glass substrate having thereon a fine pattern made of a metal thin film or the like. The photolithography is used also in the manufacture of the transfer mask.

In the manufacture of a transfer mask by photolithography, use is made of a mask blank having a thin film (e.g. a light-shielding film or the like) for forming a transfer pattern (mask pattern) on a transparent substrate such as a glass substrate. The manufacture of the transfer mask using the mask blank comprises a writing process of writing a required pattern on a resist film formed on the mask blank, a developing process of, after the writing, developing the resist film to form a required resist pattern, an etching process of etching the thin film using this resist pattern as a mask, and a process of stripping and removing the remaining resist pattern. In the developing process, a developer is supplied after writing the required pattern on the resist film formed on the mask blank to dissolve a portion of the resist film soluble in the developer, thereby forming the resist pattern. In the etching process, using this resist pattern as a mask, an exposed portion of the thin film, where the resist pattern is not formed, is removed by dry etching or wet etching, thereby forming a required mask pattern on the transparent substrate. In this manner, the transfer mask is completed.

As a type of transfer mask, a phase shift mask is known apart from a conventional binary mask having a light-shielding film pattern made of a chromium-based material on a transparent substrate.

In recent years, with higher integration of semiconductor devices, patterns finer than the transfer limit of the photolithography using the conventional ultraviolet light have been required in the semiconductor industry. In order to enable the formation of such fine patterns, the EUV lithography being an exposure technique using extreme ultraviolet (Extreme Ultra Violet: hereinafter referred to as "EUV") light is expected to be promising. Herein, the EUV light represents light in a wavelength band of the soft X-ray region or the vacuum ultraviolet region and, specifically, light having a wavelength of about 0.2 to 100 nm. A reflective mask has been proposed as a mask for use in the EUV lithography. In the reflective mask, a multilayer reflective film for reflecting EUV light as exposure light is formed on a substrate and an absorber film for absorbing the EUV light is formed in a pattern on the multilayer reflective film.

With the increasing demand for miniaturization in the lithography process as described above, problems in the lithography process are becoming remarkable. One of them is a problem about defect information of a substrate for a mask blank or the like for use in the lithography process.

Conventionally, taking the center of a substrate as the origin (0,0), the existing position of a defect of the substrate is specified by the distance from the origin (0,0) in mask blank inspection or the like. As a consequence, the position accuracy is low and there is variation in detection among apparatuses and thus, when patterning a pattern-formation thin film while avoiding the defect at the time of pattern writing, it is difficult to avoid it on the order of µm. Therefore, the defect is avoided by changing the direction of pattern transfer or roughly shifting the pattern transfer position on the order of mm.

Under these circumstances, for the purpose of enhancing the inspection accuracy of a defect position, there has been a proposal, for example, to form a fiducial mark in a substrate for a mask blank and to specify a position of a defect using the fiducial mark as a reference position.

Patent Document 1 discloses that, in order to accurately specify a position of a minute defect having a sphere-equivalent diameter of about 30 nm, at least three marks each having a sphere-equivalent diameter of 30 to 100 nm are formed in a film-forming surface of a substrate for a reflective mask blank for EUV lithography.

PRIOR ART DOCUMENT

Patent Document

Patent Document 1: WO2008/129914

SUMMARY OF THE INVENTION

Problem to be Solved by the Invention

It is possible to enhance the inspection accuracy of a defect position of a mask blank by the method of using the fiducial marks for specifying a position of a defect as disclosed in Patent Document 1.

In the meantime, in the case of a reflective mask which uses EUV light as exposure light, a defect present particularly in a multilayer reflective film is almost impossible to correct and can be a serious phase defect on a transfer pattern and, therefore, defect information on the multilayer reflective film is important in order to reduce transfer pattern defects. Therefore, it is preferable to carry out defect inspection at least after forming the multilayer reflective film to obtain defect information. For this, it is considered to be preferable to form a fiducial mark, for example, in a multilayer reflective film of a multilayer reflective film formed substrate manufactured by forming the multilayer reflective film on a substrate.

However, in the case where the fiducial mark is formed in the multilayer reflective film, various problems arise as follows.

First, in the process of forming the fiducial mark in the multilayer reflective film, there is a risk of contaminating a surface of the multilayer reflective film. The contamination of the surface of the multilayer reflective film causes a serious problem for a reflective mask, such as the occurrence of new foreign matter defects or reduction in reflectance. Although there is a possibility that foreign matter defects or the like can be removed by cleaning, high-sensitivity inspection should be carried out after the cleaning and, in some cases, need arises to repeatedly carry out inspection and cleaning so that not only the inspection cost may increase, but also new contamination risk may increase. On the surface of the multilayer reflective film, a protective film (may also be called a capping layer or a buffer layer) having an etching stopper function is normally provided for protecting the multilayer reflective film. Ru or its alloy material is often generally used as such a protective film, but it is poor in cleaning resistance so that damage due to the cleaning is large.

Further, defect inspection is carried out on the multilayer reflective film using as a reference the fiducial mark formed in the multilayer reflective film and, in an electron beam writing process in the manufacture of a mask thereafter, alignment is carried out using the fiducial mark in the state where an absorber film is formed thereon. Accordingly, there is a possibility that a change in mark shape due to the formation of the absorber film on the concave fiducial mark may cause an alignment error. Further, since the multilayer reflective film is a laminated film in which, for example, Si layers and Mo layers are alternately laminated by about 40 to 60 cycles, when the fiducial mark is formed in the multilayer reflective film, for example, by etching, its cross-sectional shape tends to be sloped and such a fiducial mark having the sloped cross section reduces the alignment accuracy.

Further, when forming the fiducial mark in the multilayer reflective film, if the multilayer reflective film is fully etched in its depth direction, etching proceeds to a surface of the glass substrate to cause a problem that recycling of the glass substrate becomes difficult.

Therefore, this invention has been made in view of such conventional problems and its object is, first, to provide a reflective mask blank that is free of contamination risk of or cleaning damage to a multilayer reflective film which otherwise occurs when a fiducial mark is formed in the multilayer reflective film, and that improves the alignment accuracy with respect to a fiducial mark in an electron beam writing process, and, second, to provide a reflective mask using this reflective mask blank and thus reduced in defects.

Means for Solving the Problem

In order to solve the above-mentioned problems, the present inventors have paid attention particularly to a formation position of a fiducial mark and, as a result of intensive studies, first, the present inventors have found that the above-mentioned problems can be solved by forming a multilayer reflective film on a substrate, then carrying out only normal defect inspection for the multilayer reflective film, then forming a laminated film on the multilayer reflective film, then forming a fiducial mark at an upper portion of the laminated film to obtain a reflective mask blank formed with the fiducial mark, and then carrying out defect inspection of the reflective mask blank using the fiducial mark as a reference. Second, the present inventors have found that the above-mentioned problems can be solved by forming a multilayer reflective film on a substrate, then carrying out only normal defect inspection for the multilayer reflective film, then forming an absorber film on the multilayer reflective film, then forming a fiducial mark in the absorber film to obtain a reflective mask blank formed with the fiducial mark, and then carrying out defect inspection of the reflective mask blank using the fiducial mark as a reference.

As a result of further intensive studies based on the elucidated fact described above, the present inventors have completed this invention.

Specifically, in order to solve the above-mentioned problems, this invention has the following structures.

(Structure 1)

A method of manufacturing a reflective mask blank comprising a multilayer reflective film formed on a substrate so as to reflect EUV light; and a laminated film formed on the multilayer reflective film; the method including the steps of depositing the multilayer reflective film on the substrate to form a multilayer reflective film formed substrate; carrying out defect inspection for the multilayer reflective film formed substrate; depositing the laminated film on the multilayer reflective film of the multilayer reflective film formed substrate; forming a fiducial mark for an upper portion of the laminated film to thereby form a reflective mask blank comprising the fiducial mark, the fiducial mark serving as a reference for a defect position in defect information; and carrying out defect inspection of the reflective mask blank by using the fiducial mark as a reference.

(Structure 2)

A method of manufacturing a reflective mask blank comprising a multilayer reflective film formed on a substrate so as to reflect EUV light; and an absorber film formed on the multilayer reflective film so as to absorb the EUV light; the method including the steps of depositing the multilayer reflective film on the substrate to form a multilayer reflective film formed substrate; carrying out defect inspection for the multilayer reflective film formed substrate; depositing the absorber film on the multilayer reflective film of the multilayer reflective film formed substrate; forming a fiducial mark for the absorber film to thereby form a reflective mask blank comprising the fiducial mark, the fiducial mark serving as a reference for a defect position in defect information; and carrying out defect inspection for the reflective mask blank by using the fiducial mark as a reference.

By forming a fiducial mark in a laminated film or an absorber film formed on a multilayer reflective film as recited in Structure 1 or 2, the following actions and effects are obtained.

1. Since only normal defect inspection is carried out and no fiducial mark formation is carried out for a multilayer reflective film formed on a substrate, there is no contamination risk of the multilayer reflective film which otherwise occurs when forming a fiducial mark in the multilayer reflective film. Accordingly, it is not necessary to carry out cleaning for removing defects due to contamination of the multilayer reflective film so that damage due to cleaning does not occur to a surface of the multilayer reflective film (a surface of a protective film). In addition, since there arises no need to repeatedly carry out cleaning for removing defects due to contamination of the multilayer reflective film and inspection, a problem of an increase in inspection cost or an increase in new contamination risk does not also arise.

2. Since defect inspection of a reflective mask blank can be carried out using as a reference a fiducial mark formed in a laminated film or an absorber film and, in an electron beam writing process in the manufacture of a mask thereafter, it is possible to carry out alignment using the same fiducial mark as described above, the alignment accuracy is improved. Further, since the thickness of the laminated film or the absorber film is thin compared to that of the multilayer reflective film and further the absorber film is a single layer or a laminated film of two or three layers at most, it is possible to shorten the processing time and to form a fiducial mark having a cross-sectional shape with high verticality and, therefore, the alignment accuracy is improved.

3. Since etching damage to a glass substrate does not occur in the process of forming the fiducial mark in the laminated film or the absorber film, recycling of the glass substrate is facilitated.

By obtaining the above-mentioned reflective mask blank formed with the fiducial mark in the laminated film or the absorber film, it is possible, in defect inspection, to determine a reference point for a defect position and to obtain accurate defect information (defect map) including defect position (relative positions between the reference point and a defect) information. Further, in the manufacture of a mask, it is possible to collate pre-designed writing data (mask pattern data) with this defect information and to accurately correct (modify) the writing data so as to reduce the influence due to defects and, as a result, it is possible to reduce defects in a finally manufactured reflective mask.

(Structure 3)

The method of manufacturing a reflective mask blank according to Structure 1 or 2, including collating defect inspection data of the multilayer reflective film formed substrate and defect inspection data of the reflective mask blank with each other based on a defect which is consistent between a defect detected by the defect inspection of the multilayer reflective film formed substrate and a defect detected by the defect inspection of the reflective mask blank; and thereby obtaining the defect inspection data of the multilayer reflective film formed substrate using as a reference the fiducial mark formed for the laminated film or the absorber film.

As recited in Structure 3, even if no fiducial mark is formed in the multilayer reflective film of the multilayer reflective film formed substrate, by collating defect inspection data of the multilayer reflective film formed substrate and defect inspection data of the reflective mask blank with each other based on a defect which is consistent between a defect detected by the defect inspection of the multilayer reflective film formed substrate and a defect detected by the defect inspection of the reflective mask blank according to Structure 1 or 2, and by carrying out coordinate conversion using as a reference the fiducial mark formed in the laminated film or the absorber film, defect inspection data of the multilayer reflective film formed substrate using as a reference the fiducial mark formed in the laminated film or the absorber film can be obtained in addition to the defect inspection data of the reflective mask blank using the fiducial mark as a reference.

(Structure 4)

The method of manufacturing a reflective mask blank according to any of Structures 1 to 3, wherein the defect inspection of the multilayer reflective film formed substrate is carried out at least for an entire surface of a pattern forming region on the multilayer reflective film formed substrate, and the defect inspection of the reflective mask blank is carried out for at least part of defects, which are detected by the defect inspection of the multilayer reflective film formed substrate, by specifying positions of the defects.

As recited in Structure 4, the defect inspection of the multilayer reflective film formed substrate is carried out at least over an entire surface of a pattern forming region on the multilayer reflective film formed substrate, while the defect inspection of the reflective mask blank is carried out for at least part of defects, detected by the defect inspection of the multilayer reflective film formed substrate, by specifying a position thereof, i.e. so-called partial inspection is carried out, so that the inspection time can be significantly shortened.

(Structure 5)

The method of manufacturing a reflective mask blank according to any of Structures 1 to 4, including forming a pseudo defect on the multilayer reflective film of the multilayer reflective film formed substrate; and collating defect inspection data of the multilayer reflective film formed substrate and defect inspection data of the reflective mask blank with each other based on the pseudo defect that is detected by the defect inspection of the multilayer reflective film formed substrate and a defect corresponding to the pseudo defect that is detected by the defect inspection of the reflective mask blank.

For the purpose of overlapping defects detected by the defect inspection of the multilayer reflective film formed substrate and defects detected by the defect inspection of the reflective mask blank and obtaining those defects which are consistent between them, the defects are not necessarily actual defects. Therefore, as recited in Structure 5, a pseudo defect may be formed in advance on the multilayer reflective film of the multilayer reflective film formed substrate and, based on the pseudo defect detected by the defect inspection of the multilayer reflective film formed substrate and a defect, corresponding to the pseudo defect, detected by the defect inspection of the reflective mask blank, defect inspection data of the multilayer reflective film formed substrate and defect inspection data of the reflective mask blank may be collated with each other.

(Structure 6)

The method of manufacturing a reflective mask blank according to any of Structures 1 to 5, including forming the fiducial mark at a predetermined position from an origin that is set based on edge coordinates of the substrate; and correlating the reflective mask blank comprising the fiducial mark and formation position information of the fiducial mark with each other.

As recited in Structure 6, if the reflective mask blank is manufactured by correlating the reflective mask blank formed with the fiducial mark at a predetermined position from an origin which was set based on edge coordinates of the substrate and formation position information of the fiducial mark with each other, a user provided with this reflective mask blank can surely detect the fiducial mark in a short time using this formation position information of the fiducial mark.

(Structure 7)

The method of manufacturing a reflective mask blank according to any of Structures 1 to 5, including specifying, after forming the fiducial mark, a formation position of the fiducial mark by a coordinate measuring apparatus; and correlating the reflective mask blank comprising the fiducial mark and formation position information of the fiducial mark with each other.

As recited in Structure 7, if the reflective mask blank is manufactured by specifying, after forming the fiducial mark in the absorber film, a formation position of the fiducial mark by a coordinate measuring apparatus and correlating the reflective mask blank formed with the fiducial mark and formation position information of the fiducial mark with each other, a user provided with this reflective mask blank can surely detect the fiducial mark in a short time using this formation position information of the fiducial mark. Since the formation position of the fiducial mark is specified by the coordinate measuring apparatus, conversion of reference coordinates of an electron beam writing apparatus is enabled. Therefore, the user provided with this reflective mask blank can accurately collate defect positions easily specified based on the fiducial mark by a defect inspection apparatus and writing data with each other so that it is possible to surely reduce defects in a finally manufactured mask.

(Structure 8)

The method of manufacturing a reflective mask blank according to Structure 6 or 7, further including adding defect information of the multilayer reflective film using the fiducial mark as a reference to the formation position information of the fiducial mark.

As recited in Structure 8, if the reflective mask blank is manufactured by adding defect information of the multilayer reflective film formed substrate or the reflective mask blank using the fiducial mark as a reference to the formation position information of the fiducial mark, a user provided with this reflective mask blank can surely detect the fiducial mark in a short time using this formation position information of the fiducial mark and, in the manufacture of a mask, the user can accurately correct (modify) writing data based on this defect information so as to reduce the influence due to defects, thereby reducing defects in a finally manufactured mask.

(Structure 9)

A method of manufacturing a reflective mask, including patterning the laminated film or the absorber film of the reflective mask blank obtained by the method of manufacturing a reflective mask blank according to any of Structures 1 to 8; and thereby forming a laminated film pattern or an absorber film pattern.

A reflective mask obtained by patterning the absorber film of the reflective mask blank of the above-mentioned structure is reduced in defects by correcting/modifying writing data based on the defect information of the multilayer reflective film formed substrate or the reflective mask blank.

Effect of the Invention

According to this invention, it is possible to provide a reflective mask blank that, by forming a fiducial mark in a laminated film or an absorber film, is free of contamination risk of or cleaning damage to a multilayer reflective film which otherwise occurs when a fiducial mark is formed in the multilayer reflective film, and improves the alignment accuracy with respect to the fiducial mark in an electron beam writing process in the manufacture of a mask, and that, by forming the fiducial mark, enables accurate management of coordinates of defects (management of relative positions between the fiducial mark and defects).

Further, according to this invention, it is possible to provide a reflective mask that is reduced in defects by using this reflective mask blank to correct writing data based on the defect information thereof.

MODE FOR CARRYING OUT THE INVENTION

Hereinbelow, embodiments of this invention will be described in detail.

[Fiducial Mark]

First, a fiducial mark in this invention (hereinafter may also be referred to as a "fiducial mark of this invention") will be described in detail.

Figure 1:
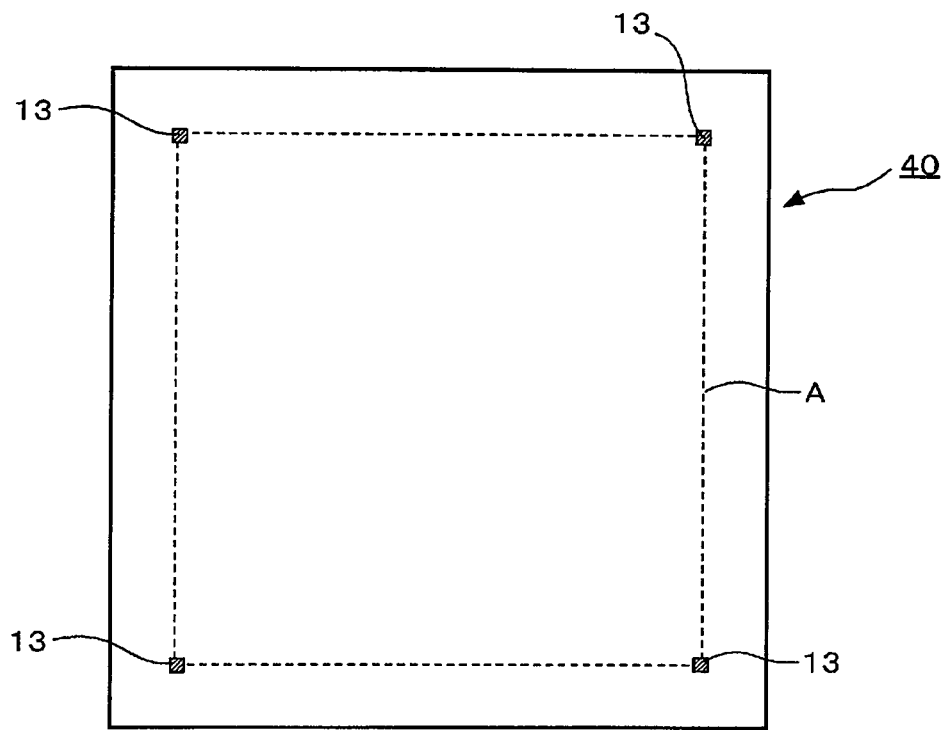
FIG. 1 is a plan view showing an example of the arrangement of fiducial marks in this invention.

FIG. 1 is a plan view of a reflective mask blank showing an example of the arrangement of fiducial marks.

In FIG. 1, for example, as one example, fiducial marks 13 of this invention are formed at four positions near corners of an absorber film of a reflective mask blank 40. As will also be described in detail later, this invention has a feature in that a fiducial mark is formed in a laminated film or an absorber film.

Although not illustrated, a rough alignment mark may be formed near the fiducial mark of this invention. The rough alignment mark is relatively larger than the fiducial mark and, while the rough alignment mark itself does not have a role of a fiducial mark, its positional relationship with the fiducial mark 13 is determined in advance so that it has a role of facilitating detection of a position of the fiducial mark 13.

In FIG. 1, all the fiducial marks 13 are preferably formed on a boundary line of a pattern forming region, defined by a broken line A, of a main surface of the reflective mask blank or on the outer peripheral edge side outside the pattern forming region. However, if it is too close to the substrate outer peripheral edge, there is a possibility of crossing another kind of identification mark, which is thus not preferable.

The number of the fiducial marks is not particularly limited. With respect to the fiducial marks, the number of them should be at least three and may be three or more.

Figure 2:
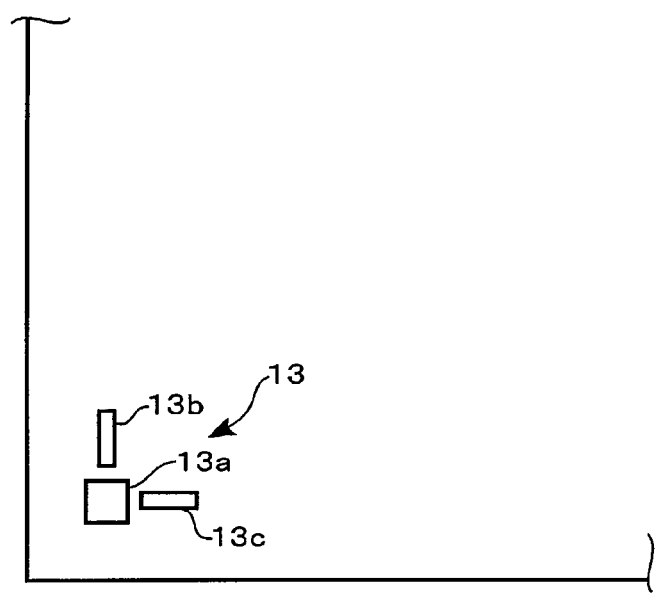
FIG. 2 is a diagram showing an example of the shape and arrangement of a main mark and auxiliary marks constituting the fiducial mark in this invention.
Figure 3:
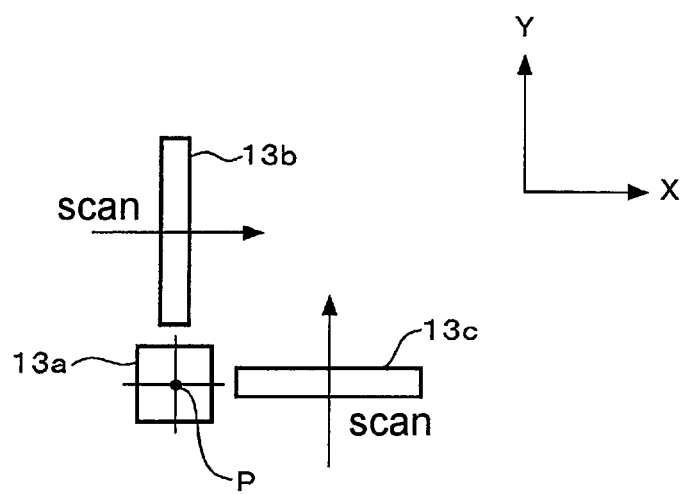
FIG. 3 is a diagram for explaining a method of determining a reference point using the fiducial mark in this invention.

FIG. 2 is a diagram showing an example of the shape and arrangement of a main mark and auxiliary marks constituting the fiducial mark of this invention. FIG. 3 is a diagram for explaining a method of determining a reference point using the fiducial mark of this invention.

The fiducial mark serves as a reference for a defect position in defect information. The fiducial mark 13 of this invention comprises a main mark for determining a position (reference point) that serves as a reference for a defect position and auxiliary marks arranged around the main mark. Preferably, the main mark has a point-symmetrical shape and has a portion with a width of 200 nm or more and 10 µm or less with respect to a scanning direction of an electron beam or defect inspection light.

FIGS. 2 and 3 show, by way of example, the fiducial mark 13 comprising a main mark 13a and two auxiliary marks 13b and 13c arranged around the main mark 13a.

In this invention, the main mark 13a preferably has a polygonal shape having at least two pairs of sides each perpendicular to and parallel to scanning directions of an electron beam writing apparatus or defect inspection light (X- and Y-directions in FIG. 3). In this manner, when the main mark 13a has the polygonal shape having at least two pairs of sides each perpendicular to and parallel to the scanning directions of the electron beam or the defect inspection light, it is possible to improve ease (reliability) of detection by an electron beam writing apparatus or a defect inspection apparatus and to suppress variation in defect detection position. FIGS. 2 and 3 show, as a specific example, a case where the main mark 13a has a square shape with the same length in longitudinal and lateral directions (X- and Y-directions). In this case, the longitudinal and lateral lengths (L) are each 200 nm or more and 10 µm or less.

Figure 4:
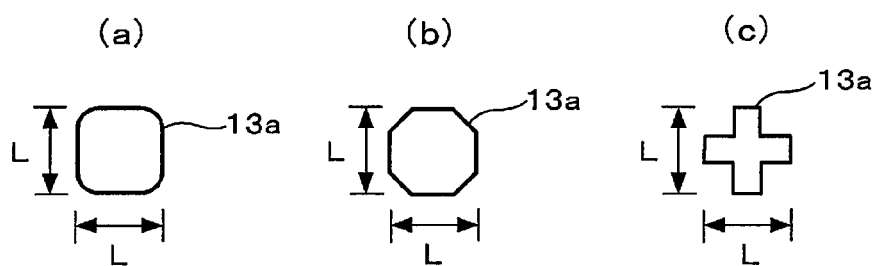
FIG. 4 is diagrams each showing another example of the shape of a main mark.

The main mark 13a preferably has a point-symmetrical shape. The shape is not limited to the above-mentioned square shape and may be, for example, a square shape with rounded corners as shown at (a) in FIG. 4, an octagonal shape as shown at (b) in the same figure, or a cross shape as shown at (c) in the same figure. Also in this case, the dimensions (longitudinal and lateral lengths (L)) of the main mark 13a are each preferably set to 200 nm or more and 10 µm or less. As a specific example, in the case of the main mark 13a having the cross shape, its dimensions (longitudinal and lateral lengths) may each be set to 5 µm or more and 10 µm or less. Although not illustrated, the main mark 13a may alternatively have a perfect circular shape with a diameter of 200 nm or more and 10 µm or less.

The two auxiliary marks 13b and 13c are arranged around the main mark 13a along scanning directions of an electron beam or defect inspection light (X- and Y-directions in FIG. 3). In this invention, the auxiliary marks 13b and 13c each preferably have a rectangular shape with long sides perpendicular to and short sides parallel to the scanning direction of the electron beam or the defect inspection light. When the auxiliary mark has the rectangular shape with the long sides perpendicular to and the short sides parallel to the scanning direction of the electron beam or the defect inspection light, it can be surely detected by scanning with the electron beam writing apparatus or the defect inspection apparatus so that a position of the main mark can be easily specified. In this case, the long side preferably has a length that is detectable by the minimum number of times of scanning with the electron beam writing apparatus or the defect inspection apparatus. For example, the long side preferably has a length of 25 µm or more and 600 µm or less. On the other hand, if the length of the long side is short, for example, less than 25 µm, there is a possibility that the auxiliary mark cannot be easily detected by scanning with the electron beam writing apparatus or the defect inspection apparatus. If the length of the long side is long, for example, more than 600 µm, the processing time exceeds one hour per portion depending on a fiducial mark forming method, which is thus not preferable. The length of the long side is more preferably 25 µm or more and 400 µm or less and further preferably 25 µm or more and 200 µm or less.

The auxiliary mark 13b, 13c and the main mark 13a may be spaced apart from each other by a predetermined distance or are not necessarily spaced apart from each other. When the auxiliary mark and the main mark are spaced apart from each other, the distance therebetween is not particularly limited, but, in this invention, it is preferably in a range of, for example, about 25 µm to 50 µm.

The main mark 13a and the auxiliary marks 13b and 13c each have a concave cross-sectional shape and are provided with a required depth in a height direction of the fiducial mark, thereby forming the fiducial mark that can be recognized. In terms of improving the detection accuracy by an electron beam or defect inspection light, the cross-sectional shape is preferably formed to widen from the bottom of the concave shape toward the surface side and, in this case, the inclination angle of a side wall of the fiducial mark is preferably 75 degrees or more, more preferably 80 degrees or more, and further preferably 85 degrees or more. The upper limit of the inclination angle of the side wall of the fiducial mark is preferably 105 degrees or less, more preferably 100 degrees or less, and further preferably 95 degrees or less. The inclination angle of the side wall of the fiducial mark is preferably 75 degrees or more and 105 degrees or less, more preferably 80 degrees or more and 100 degrees or less, and further preferably 85 degrees or more and 95 degrees or less.

Using the fiducial mark described above, a reference point that serves as a reference for a defect position is determined in the following manner (see FIG. 3).

When an electron beam or defect inspection light scans over the auxiliary marks 13b and 13c in the X- and Y-directions and detects these auxiliary marks, a position of the main mark 13a can be roughly specified. After an electron beam or inspection light scans over the main mark 13a, whose position was specified, in the X- and Y-directions, a reference point is determined as an intersection point P (normally, the approximate center of the main mark) over the main mark 13a (detected by the scanning of the auxiliary marks).

As described above, the auxiliary marks 13b and 13c each preferably have a rectangular shape with long sides perpendicular to and short sides parallel to a scanning direction of an electron beam or defect inspection light. In this case, the long side preferably has a length that is detectable by the minimum number of times of scanning with the electron beam writing apparatus or the defect inspection apparatus, for example, a length of 25 µm or more and 600 µm or less. However, if, for example, this length of about several hundred µm is formed by a focused ion beam, the processing time is required to be long.

Figure 5:
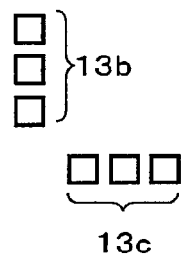
FIG. 5 is a diagram showing another example of the shape of auxiliary marks.
Figure 6:
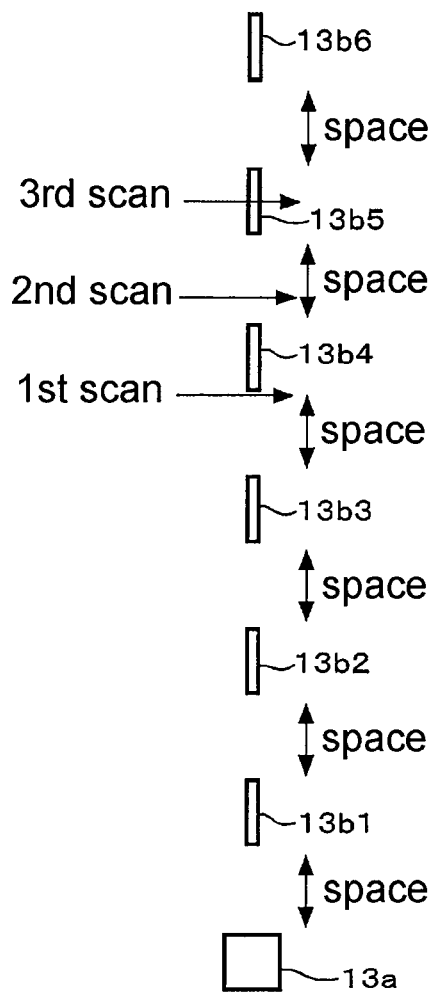
FIG. 6 is a diagram for explaining one example of a method of detecting an auxiliary mark.

In view of this, as shown in FIG. 5, the auxiliary mark can be divided into several rectangles. FIG. 6 is an example specifically showing such a configuration, wherein rectangular auxiliary marks 13b1 to 13b6 each having a size of 50 µm×1 µm are arranged at regular intervals on one side (Y-direction) of a main mark 13a having a size of 5 µm×5 µm and the interval (space) between the auxiliary marks is set to 50 µm.

In this case, for example, a first scan (first scanning) misses the auxiliary mark, then a second scan (second scanning) shifted upward (Y-direction) by 60 µm also misses the auxiliary mark, and then a third scan (third scanning) shifted further upward by 60 μm can detect the auxiliary mark 13b5.

Even if the auxiliary mark is divided and the length of the long side of each of the divided individual auxiliary marks is shortened as described above, the auxiliary mark can be surely detected with the minimum number of times of scanning by determining the scanning rule. Further, the overall processing time can be shortened by dividing the auxiliary mark as described above.

In the case of a reflective mask which uses EUV light as exposure light, a defect present particularly in a multilayer reflective film is almost impossible to correct and can be a serious phase defect on a transfer pattern and, therefore, defect information on the multilayer reflective film is important in order to reduce transfer pattern defects. Therefore, it is preferable to carry out defect inspection at least after forming the multilayer reflective film to obtain defect information. However, if a fiducial mark of this invention is formed, for example, in a multilayer reflective film of a multilayer reflective film formed substrate, there arise various problems as described before. Therefore, in this invention, while high-sensitivity defect inspection is carried out on the multilayer reflective film, the fiducial mark is formed in a laminated film or an absorber film formed on the multilayer reflective film and, thereafter, defect inspection of a reflective mask blank is carried out using the fiducial mark.

As described above, the fiducial mark of this invention can be easily detected, i.e. can be surely detected, by either an electron beam writing apparatus or an optical defect inspection apparatus. Further, since it has the point-symmetrical shape, the offset of a reference point for a defect position, which is determined by scanning with an electron beam or defect inspection light, can be made small. Therefore, variation in defect detection position inspected based on the fiducial mark is small. By this, in defect inspection, it is possible to determine a reference point for a defect position and to obtain accurate defect information (defect map) including defect position (relative positions between the reference point and a defect) information. Further, in the manufacture of a mask, it is possible to collate pre-designed writing data (mask pattern data) with this defect information and to accurately correct (modify) the writing data so as to reduce the influence due to defects and, as a result, it is possible to reduce defects in a finally manufactured reflective mask.

In the above-mentioned embodiment, the description has been given of the example in which the two auxiliary marks 13b and 13c are arranged around the main mark 13a along the scanning directions of the electron beam writing apparatus or the defect inspection apparatus (X- and Y-directions). However, this invention is not limited to such an embodiment. For example, in a system where defect detection is not based on scanning with inspection light, if the positional relationship between a main mark and an auxiliary mark is specified, the arrangement position of the auxiliary mark relative to the main mark is arbitrary. Further, in this case, not the center of the main mark, but its edge can alternatively be used as a reference point.

As described above, the fiducial mark 13 of this invention is preferably formed at an arbitrary position on the boundary line of the pattern forming region, defined by the broken line A, of the main surface of the reflective mask blank or on the outer peripheral edge side outside the pattern forming region (see FIG. 1). In this case, it is preferable to form the fiducial mark on an edge basis or to form the fiducial mark and then specify a formation position of the fiducial mark by a coordinate measuring apparatus.

Figure 7:
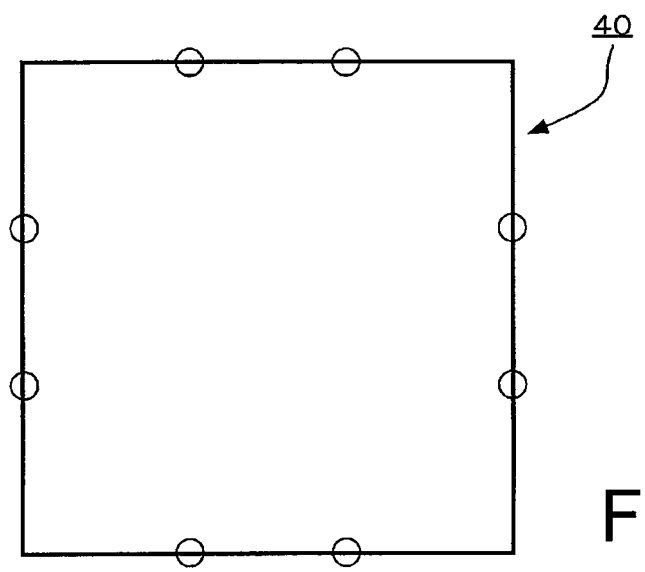
FIG. 7 is a diagram for explaining a method of forming a fiducial mark on an edge basis.
Figure 8:
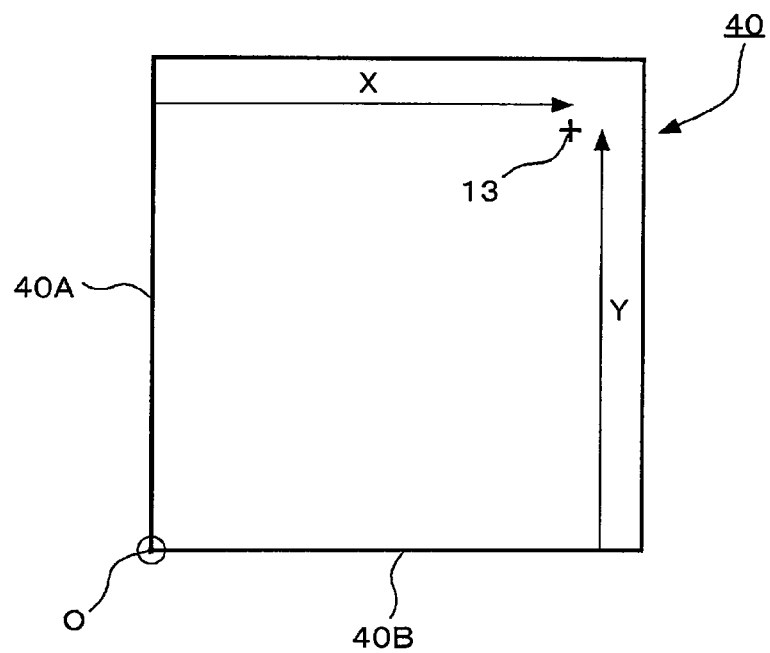
FIG. 8 is a diagram for explaining a method of forming a fiducial mark on an edge basis.

First, a method of forming a fiducial mark on the above-mentioned edge basis will be described. FIGS. 7 and 8 are diagrams each for explaining a method of forming a fiducial mark on the edge basis.

For example, when forming a fiducial mark in an absorber film using FIB (focused ion beam) as a fiducial mark forming means, detection of edges of a substrate of a reflective mask blank having the absorber film is carried out. When processing the fiducial mark by FIB, the edges of the substrate of the reflective mask blank can be recognized by a secondary electron image, a secondary ion image, or an optical image. When processing the fiducial mark by photolithography, the edges of the reflective mask blank can be recognized by an optical image or by pressing the reflective mask blank against one side of a stage on which the reflective mask blank is placed. When processing the fiducial mark by another method (e.g. impression), the edges can be recognized by an optical image. As shown in FIG. 7, for example, edge coordinates of eight portions (circled portions) of four sides of the substrate of the reflective mask blank 40 are confirmed, and then tilt correction is carried out to obtain the origin (0,0). The origin in this case can be arbitrarily set and may be a corner or the center of the substrate.

A fiducial mark is formed by FIB at a predetermined position from the origin which was set on the edge basis as described above. FIG. 8 shows a case where a fiducial mark 13 is formed at a predetermined position from the origin O (0,0) which was set at an arbitrary corner of the substrate on the edge basis, specifically, at a position distanced by X and Y respectively from the edges of end faces 40A and 40B both adjacent to the origin O. In this case, fiducial mark formation coordinates (X,Y) based on the origin O (0,0) serve as fiducial mark formation position information. This also applies to a fiducial mark which is formed at another position.

When detecting the fiducial mark of the reflective mask blank, formed on such an edge basis, using a defect inspection apparatus or an electron beam writing apparatus, since the fiducial mark formation position information, i.e. the distances from the edges, is known, it is possible to easily specify a formation position of the fiducial mark.

Alternatively, it is also possible to apply a method of forming a fiducial mark at an arbitrary position of a laminated film or an absorber film of a reflective mask blank and then specifying a fiducial mark formation position by a coordinate measuring apparatus. This coordinate measuring apparatus measures fiducial mark formation coordinates on an edge basis and use can be made of, for example, a highly accurate pattern position measuring apparatus (LMS-IPRO4 manufactured by KLA-Tencor Corporation). The specified fiducial mark formation coordinates serve as fiducial mark formation position information. The coordinate measuring apparatus also serves to carry out conversion into reference coordinates of an electron beam writing apparatus and, therefore, a user provided with the reflective mask blank can accurately collate defect positions easily specified based on the fiducial mark by a defect inspection apparatus and writing data with each other so that it is possible to surely reduce defects in a finally manufactured mask.

As described above, according to the method of forming the fiducial mark on the edge basis or forming the fiducial mark at the arbitrary position and then specifying the fiducial mark formation position by the coordinate measuring apparatus, since it is possible to easily specify the formation position of the fiducial mark on the reflective mask blank using the defect inspection apparatus or the electron beam writing apparatus, it is possible to reduce the size of the fiducial mark. Specifically, when the fiducial mark 13 of this invention comprises the main mark and the auxiliary marks, the width of the main mark can be set to 200 nm or more and 10 µm or less and the length of the long side of the auxiliary mark can be set to, for example, 25 µm or more and 250 µm or less. When the size of the fiducial mark is reduced as described above, if, for example, the FIB is employed as the fiducial mark forming means, the fiducial mark processing time can be shortened, which is thus preferable. Further, the fiducial mark detection time can also be shortened, which is thus preferable.

Figure 9:
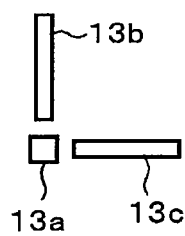
FIG. 9 is diagrams each showing an example of the shape and arrangement of a fiducial mark when it is formed on an edge basis.
Figure 9:
Figure 9:
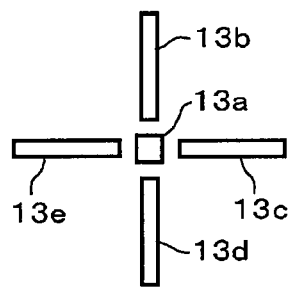
Figure 9:
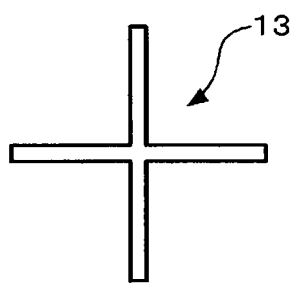

FIG. 9 shows examples of the shape and arrangement of fiducial marks when forming them on the edge basis as described above, wherein the fiducial mark comprising a main mark 13a and auxiliary marks 13b and 13c as shown at (a) in the same figure is a typical example. Since the size of the fiducial mark can be reduced as described above, the auxiliary marks are not necessarily required and thus, for example, the fiducial mark may consist of only a main mark 13a as shown at (b) in the same figure. Alternatively, the fiducial mark may be such that four auxiliary marks 13b to 13e are arranged around a main mark 13a as shown at (c) in the same figure or the fiducial mark may be a cross-shaped fiducial mark as shown at (d) in the same figure.

If a reflective mask blank formed with a fiducial mark at a predetermined position from the origin which was set based on edge coordinates of a substrate and fiducial mark formation position information (fiducial mark formation coordinates) in this case are correlated with each other and provided to a user, the user can surely detect the fiducial mark in a short time using this fiducial mark formation position information, for example, in a mask manufacturing process.

If a reflective mask blank is formed with a fiducial mark, then a formation position of the fiducial mark is specified by a coordinate measuring apparatus, and then the reflective mask blank formed with the fiducial mark and fiducial mark formation position information (specified fiducial mark position coordinates) in this case are correlated with each other and provided to a user, the user can surely detect the fiducial mark in a short time using this fiducial mark formation position information. Since the formation position of the fiducial mark is specified by the coordinate measuring apparatus, conversion of reference coordinates of an electron beam writing apparatus is enabled. Therefore, the user provided with the reflective mask blank can accurately collate defect positions easily specified based on the fiducial mark by a defect inspection apparatus and writing data with each other so that it is possible to surely reduce defects in a finally manufactured mask.

If defect information (position information, size, etc.) using the fiducial mark as a reference is added to the above-mentioned fiducial mark formation position information and provided to the user, the user can surely detect the fiducial mark in a short time using this fiducial mark formation position information and further can accurately correct (modify) writing data based on this defect information so as to reduce the influence due to defects, thereby reducing defects in a finally manufactured mask.

[Reflective Mask Blank]

Next, a method of manufacturing a reflective mask blank formed with a fiducial mark according to this invention will be described.

According to this invention recited in the aforementioned Structure 1, a method of manufacturing a reflective mask blank comprises a multilayer reflective film formed on a substrate so as to reflect EUV light; and a laminated film formed on the multilayer reflective film. The method includes the steps of depositing (or forming) the multilayer reflective film on the substrate to form a multilayer reflective film formed substrate; carrying out defect inspection for the multilayer reflective film formed substrate; depositing the laminated film on the multilayer reflective film of the multilayer reflective film formed substrate; forming a fiducial mark for an upper portion of the laminated film to thereby form a reflective mask blank comprising the fiducial mark, the fiducial mark serving as a reference for a defect position in defect information; and carrying out defect inspection of the reflective mask blank by using the fiducial mark as a reference.

Further, according to this invention recited in the aforementioned Structure 2, a method of manufacturing a reflective mask blank comprises a multilayer reflective film formed on a substrate so as to reflect EUV light; and an absorber film formed on the multilayer reflective film so as to absorb the EUV light. The method includes the steps of depositing the multilayer reflective film on the substrate to form a multilayer reflective film formed substrate; carrying out defect inspection for the multilayer reflective film formed substrate; depositing the absorber film on the multilayer reflective film of the multilayer reflective film formed substrate; forming a fiducial mark for the absorber film to thereby form a reflective mask blank comprising the fiducial mark, the fiducial mark serving as a reference for a defect position in defect information; and carrying out defect inspection for the reflective mask blank by using the fiducial mark as a reference.

Figure 10:
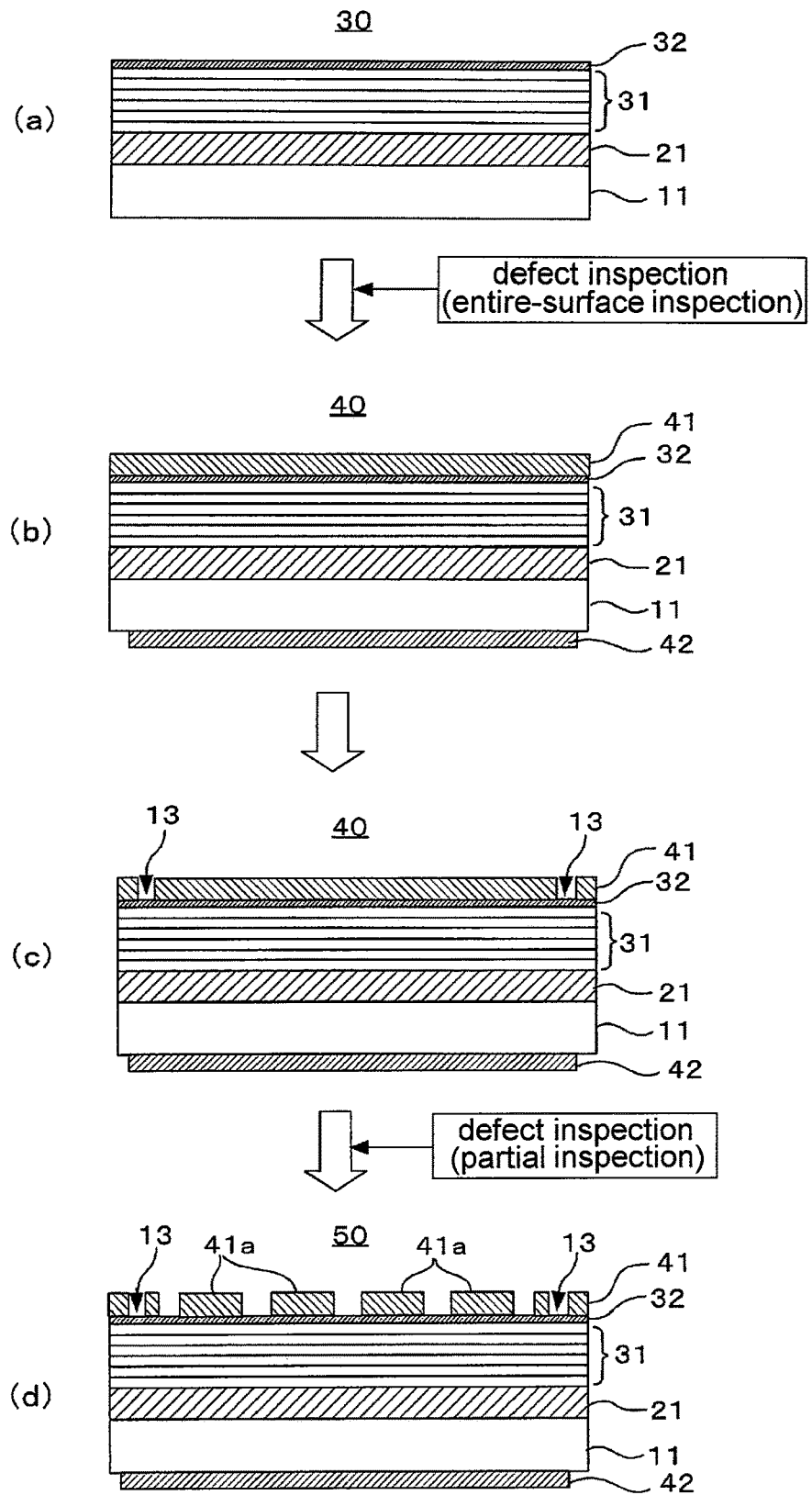
FIG. 10 is cross-sectional views showing manufacturing processes of a reflective mask blank and a reflective mask according to this invention.

FIG. 10 is cross-sectional views showing manufacturing processes of a reflective mask blank and a reflective mask according to this invention. Hereinbelow, a description will be given according to the processes shown in FIG. 10.

In the following description, the method of manufacturing the reflective mask blank of Structure 2 will be described. However, the following description can also be applied to the method of manufacturing the reflective mask blank of Structure 1 in which an absorber film 41 or the relationship between an absorber film 41 and a hard mask film 61 is replaced by the laminated film. Although details will be described later, the absorber film 41 is not limited to a single-layer film and may be in the form of a laminated film of the same material or a laminated film of different kinds of materials. The reflective mask blank according to this invention may include a laminated film of the laminated or single-layer absorber film described above and the hard mask film. When manufacturing the reflective mask blank in which the laminated film is formed on the multilayer reflective film as in Structure 1, it is satisfactory if the fiducial mark is formed by removing at least the upper portion of the laminated film, while the fiducial mark may be formed by fully removing the laminated film in its thickness direction. For example, when the structure of the laminated film of the absorber film and the hard mask film described above is included, it is satisfactory if at least the hard mask film is formed with the fiducial mark.

First, an underlayer 21, a multilayer reflective film 31 for reflecting EUV light, and a protective film 32 are formed in this order on a glass substrate 11 as a substrate, thereby manufacturing a multilayer reflective film formed substrate 30 (see FIG. 10(a)).

For EUV exposure, the glass substrate 11 is preferable as a substrate and, particularly, in order to prevent distortion of a pattern due to heat in exposure, use is preferably made of a material having a low thermal expansion coefficient in a range of $0\pm1.0\times10^{-7}/°$ C., more preferably in a range of $0\pm0.3\times10^{-7}/°$ C. As the material having the low thermal expansion coefficient in this range, it is possible to use, for example, a $SiO_2$—$TiO_2$-based glass, a multicomponent glass-ceramic, or the like.

A main surface, on the side where a transfer pattern is to be formed, of the glass substrate 11 is surface-machined to have high flatness in terms of ensuring at least pattern transfer accuracy and pattern position accuracy. For EUV exposure, the flatness is preferably 0.1 μm or less and particularly preferably 0.05 μm or less in a 142 mm×142 mm region of the main surface, on the side where the transfer pattern is to be formed, of the glass substrate 11. A main surface, on the side opposite to the side where the transfer pattern is to be formed, of the glass substrate 11 is a surface which is electrostatically chucked when it is set in an exposure apparatus. The flatness thereof is 0.1 μm or less, preferably 0.05 μm or less in a 142 mm×142 mm region.

As described above, the material having the low thermal expansion coefficient, such as the $SiO_2$—$TiO_2$-based glass, is used as the glass substrate 11. However, with such a glass material, it is difficult to achieve high smoothness such as a surface roughness of, for example, 0.1 nm or less in RMS by precision polishing. Therefore, it is preferable to form the underlayer 21 on the surface of the glass substrate 11 for the purpose of reducing the surface roughness of the glass substrate 11 or reducing defects of the surface of the glass substrate 11. As a material of such an underlayer 21, it does not need to have translucency for exposure light and it is preferable to select a material that can obtain high smoothness when a surface of the underlayer is precision-polished and that is excellent in defect quality. For example, Si or a silicon compound containing Si (e.g. $SiO_2$, SiON, or the like) is preferably used because high smoothness is obtained when precision-polished and the defect quality is excellent. Si is particularly preferable.

It is preferable that the surface of the underlayer 21 be precision-polished to a smoothness which is required as a substrate for a reflective mask blank. It is preferable that the surface of the underlayer 21 be precision-polished to a root mean square roughness (RMS) of 0.15 nm or less, particularly preferably 0.1 nm or less. In consideration of the influence on a surface of the multilayer reflective film 31 which is formed on the underlayer 21, it is preferable to precision-polish the surface of the underlayer 21 so that, in terms of the relationship with the maximum height (Rmax), Rmax/RMS becomes 2 to 10, particularly preferably 2 to 8.

The thickness of the underlayer 21 is preferably in a range of, for example, 10 nm to 300 nm.

The multilayer reflective film 31 is a multilayer film in which low refractive index layers and high refractive index layers are alternately laminated. Generally, use is made of a multilayer film in which thin films of a heavy element or its compound and thin films of a light element or its compound are alternately laminated by about 40 to 60 cycles.

For example, as a multilayer reflective film for EUV light having a wavelength of 13 to 14 nm, use is preferably made of a Mo/Si cycle multilayer film in which Mo films and Si films are alternately laminated by about 40 cycles. Other than this, as a multilayer reflective film for use in a region of EUV light, there is a Ru/Si cycle multilayer film, a Mo/Be cycle multilayer film, a Mo compound/Si compound cycle multilayer film, a Si/Nb cycle multilayer film, a Si/Mo/Ru cycle multilayer film, a Si/Mo/Ru/Mo cycle multilayer film, a Si/Ru/Mo/Ru cycle multilayer film, or the like. The material may be properly selected according to an exposure wavelength.

Normally, for the purpose of protecting the multilayer reflective film in patterning an absorber film or in pattern correction, the protective film 32 (may also be called a capping layer or a buffer film) is provided on the multilayer reflective film 31. As a material of such a protective film 32, use is made of silicon, ruthenium, or a ruthenium compound containing ruthenium and one or more elements from niobium, zirconium, and rhodium, or alternatively, use may be made of a chromium-based material.

The thickness of the protective film 32 is preferably in a range of, for example, about 1 nm to 5 nm.

A method of forming the underlayer 21, the multilayer reflective film 31, and the protective film 32 described above is not particularly limited, but, normally, ion-beam sputtering, magnetron sputtering, or the like is preferable.

Figure 11:
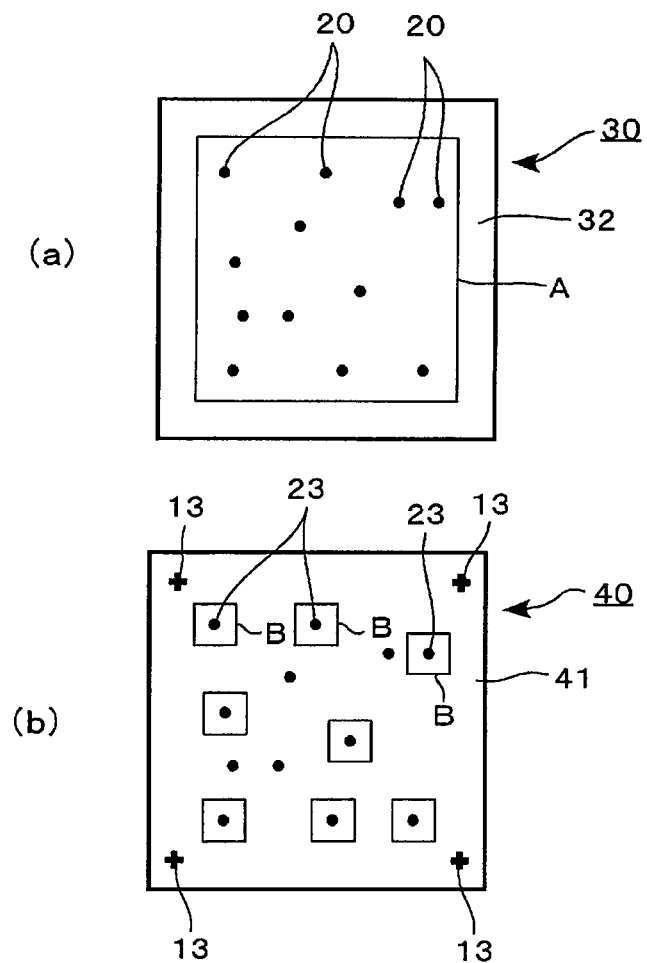
FIG. 11 is plan views of a multilayer reflective film formed substrate and a reflective mask blank for explaining defect inspection in this invention.

Then, defect inspection is carried out for the multilayer reflective film formed substrate 30 thus manufactured. In this case, since no fiducial mark is formed at the stage of the multilayer reflective film formed substrate, defect inspection is carried out for the multilayer reflective film formed substrate 30 by a defect inspection apparatus using, for example, the center of its main surface as a reference point, thereby obtaining defects and their position information detected by the defect inspection. In this case, the defect inspection is carried out at least over the entire surface of a pattern forming region. In FIG. 11, (a) exemplarily shows the results of the defect inspection carried out for the multilayer reflective film formed substrate 30, wherein shown black circles (●) 20 indicate positions of defects detected by way of example.

Then, an absorber film 41 for absorbing EUV light is formed on the protective film 32 of the multilayer reflective film formed substrate 30, thereby manufacturing a reflective mask blank 40 (see FIG. 10(b)).

In the reflective mask blank 40 shown in FIG. 10(b), a back-side conductive film 42 is provided on the side, opposite to the side where the multilayer reflective film and so on are formed, of the glass substrate 11.

The absorber film 41 has the function of absorbing EUV light as exposure light and is satisfactory if it provides a predetermined reflectance difference between reflected light from the multilayer reflective film 31/the protective film 32 and reflected light from an absorber film pattern 41a in a reflective mask 50 manufactured using the reflective mask blank 40. For example, the reflectance of the absorber film 41 for EUV light is selected from 0.1% or more and 40% or less. In addition to the reflectance difference, the absorber film 41 may also be configured to provide a predetermined phase difference between the reflected light from the multilayer reflective film 31/the protective film 32 and the reflected light from the absorber film pattern 41a. When the predetermined phase difference is provided between the reflected light from the multilayer reflective film 31/the protective film 32 and the reflected light from the absorber film pattern 41a, the absorber film 41 of the reflective mask blank 40 may be referred to as a phase shift film. When the predetermined phase difference is provided between the reflected light from the multilayer reflective film 31/the protective film 32 and the reflected light from the absorber film pattern 41a to thereby improve the contrast, the phase difference is preferably set in a range of 180 degrees±10 degrees, while the reflectance of the absorber film 41 is preferably set to 3% or more and 40% or less.

The absorber film 41 may be a single layer or may have a laminated structure. In the case of the laminated structure, the absorber film 41 may be a laminated film of the same material or a laminated film of different kinds of materials. The laminated film may be such that its material and composition change stepwise and/or continuously in its thickness direction.

As a material of the absorber film 41, use is preferably made of, for example, tantalum (Ta) alone or a material containing Ta. As the material containing Ta, use is made of a material containing Ta and B, a material containing Ta and N, a material containing Ta and B and further containing at least one of O and N, a material containing Ta and Si, a material containing Ta, Si, and N, a material containing Ta and Ge, a material containing Ta, Ge, and N, a material containing Ta and Pd, a material containing Ta and Ru, or the like. As a material other than Ta, it may be Cr alone or a material containing Cr, Ru alone or a material containing Ru, Pd alone or a material containing Pd, or Mo alone or a material containing Mo. When the absorber film 41 is a laminated film, it may have a laminated structure in which the materials listed above are combined together.

The thickness of the absorber film 41 is preferably in a range of, for example, about 30 nm to 100 nm. A method of forming the absorber film 41 is not particularly limited, but, normally, magnetron sputtering, ion-beam sputtering, or the like is preferable.

Then, the fiducial marks described before are formed on the reflective mask blank 40 thus manufactured. Since the fiducial mark has already been described in detail, a description thereof is omitted herein.

Herein, using a focused ion beam (FIB), fiducial marks 13 of, for example, a cross shape are formed at predetermined positions of the absorber film 41 of the reflective mask blank 40 (see FIG. 10(*c*)).

In FIG. 10(*c*), there is shown an example in which the fiducial marks 13 are each formed by removing the absorber film 41 so that the protective film 32 is exposed. Alternatively, each fiducial mark 13 may be formed by removing the absorber film 41 partially in depth.

Then, defect inspection is carried out for the reflective mask blank 40 formed with the fiducial marks, which was manufactured as described above.

In this case, defect inspection is carried out by a defect inspection apparatus using the fiducial marks 13 as references, thereby obtaining defects and their position information detected by the defect inspection. In FIG. 11, (*b*) exemplarily shows the results of the defect inspection carried out for the reflective mask blank 40, wherein shown black circles (●) 23 indicate positions of defects detected by way of example.

In this invention, since no fiducial mark is formed at the stage of the defect inspection of the multilayer reflective film formed substrate, the defect inspection and the management of coordinates of defects using the fiducial marks as references can be carried out in the following manner for the reflective mask blank.

Since the absorber film 41 is formed over the multilayer reflective film 31 as described above, the defect inspection data of the reflective mask blank 40 also reflects the defect inspection of the multilayer reflective film formed substrate 30 obtained above. Therefore, by collating the defect inspection data of the multilayer reflective film formed substrate and the defect inspection data of the reflective mask blank with each other based on those defects which are consistent between the defects of the multilayer reflective film formed substrate and the defects of the reflective mask blank, defect inspection data of the multilayer reflective film formed substrate and the defect inspection data of the reflective mask blank, both using the fiducial marks as references, can be obtained.

That is, in this invention, even if no fiducial mark is formed in the multilayer reflective film 31 of the multilayer reflective film formed substrate 30, by collating the defect inspection data of the multilayer reflective film formed substrate 30 and the defect inspection data of the reflective mask blank 40 with each other based on those defects which are consistent between the defects detected by the defect inspection of the multilayer reflective film formed substrate 30 and the defects detected by the defect inspection of the reflective mask blank 40, and by carrying out coordinate conversion using as references the fiducial marks 13 formed in the absorber film 41, defect inspection data of the multilayer reflective film formed substrate 30 using as references the fiducial marks 13 formed in the absorber film 41 can be obtained in addition to the defect inspection data of the reflective mask blank 40 using the fiducial marks 13 as references.

The above-mentioned defect inspection of the multilayer reflective film formed substrate 30 is carried out at least over the entire surface of the pattern forming region on the multilayer reflective film formed substrate, while, with respect to the defect inspection of the reflective mask blank 40, although entire-surface inspection may of course be carried out, the inspection time can be significantly shortened by carrying out partial inspection. That is, the defect inspection of the reflective mask blank 40 is carried out for at least part of the defects, detected by the defect inspection of the multilayer reflective film formed substrate 30, in an area of about 1 mm square for each defect by specifying its position. The area is set in consideration of the position offset in the inspection. For example, the defect inspection of the reflective mask blank 40 is carried out by specifying certain regions B respectively including defect positions 23 corresponding to part of (a plurality of) of the defects detected by the defect inspection of the multilayer reflective film formed substrate 30 (see FIG. 11(*b*)). For example, while about four hours are normally required for carrying out entire-surface inspection of a 100 mm×100 mm region, the inspection time can be significantly shortened to, for example, about 10 minutes or less by carrying out the above-mentioned partial inspection.

A method of forming the fiducial marks 13 is not limited to the above-mentioned method of using a focused ion beam. For example, when the cross-sectional shape of the fiducial marks is concave, the fiducial marks can be formed by photolithography, recess formation by laser light, machining trace by scanning a diamond stylus, indention by a microindenter, stamping by an imprint method, or the like.

Figure 12:
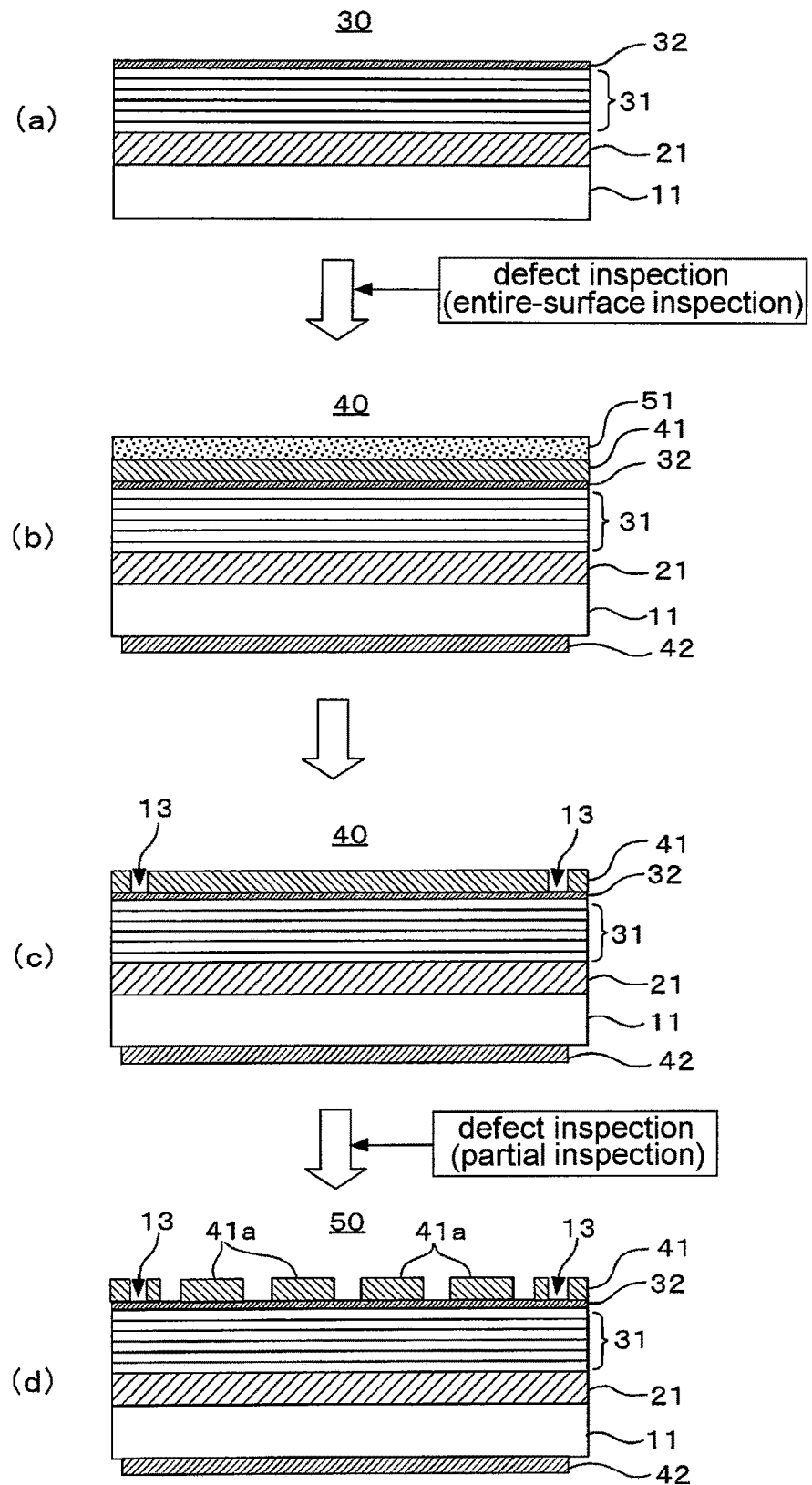
FIG. 12 is cross-sectional views showing another embodiment of manufacturing processes of a reflective mask blank and a reflective mask according to this invention.

In manufacturing processes of a reflective mask blank shown in FIG. 12, there is shown a case where the above-mentioned fiducial marks 13 are formed by photolithography. The same symbols are assigned to portions equivalent to those in FIG. 10, thereby omitting a duplicate description thereof herein.

When forming fiducial marks by photolithography, a resist film 51 is formed on a surface of a reflective mask blank 40 as shown in FIG. 12(*b*). Patterns of fiducial marks 13 are written or exposed on the resist film 51 and then development is carried out, thereby forming a resist pattern corresponding to the fiducial marks 13. Then, using this resist pattern as a mask, an absorber film 41 is, for example, dry-etched, thereby forming the required fiducial marks 13 at predetermined positions of the absorber film 41 (see FIG. 12(c)).

The fiducial mark formed by photolithography using dry etching as described above can be finished to a cross-sectional shape with better side wall verticality compared to a fiducial mark formed by a focused ion beam and, therefore, for example, it is possible to further improve the alignment accuracy of a fiducial mark in an electron beam writing process in the manufacture of a mask.

In this invention, for the purpose of overlapping defects detected by defect inspection of a multilayer reflective film formed substrate and defects detected by defect inspection of a reflective mask blank and obtaining those defects which are consistent between them, the defects are not necessarily actual defects. Therefore, pseudo defects may be formed in advance on a multilayer reflective film of a multilayer reflective film formed substrate and, based on the pseudo defects detected by defect inspection of the multilayer reflective film formed substrate and defects, corresponding to the pseudo defects, detected by defect inspection of a reflective mask blank, defect inspection data of the multilayer reflective film formed substrate and defect inspection data of the reflective mask blank may be collated with each other.

As described above, in this invention, by forming a fiducial mark in an absorber film formed on a multilayer reflective film with no fiducial mark formed in the multilayer reflective film, the following actions and effects are obtained.

1. Since only normal defect inspection is carried out and no fiducial mark formation is carried out for a multilayer reflective film formed on a substrate, there is no contamination risk of the multilayer reflective film which otherwise occurs when forming a fiducial mark in the multilayer reflective film. Accordingly, it is not necessary to carry out cleaning for removing defects due to contamination of the multilayer reflective film so that damage due to cleaning does not occur to a surface of the multilayer reflective film (a surface of a protective film). In addition, since there arises no need to repeatedly carry out cleaning for removing defects due to contamination of the multilayer reflective film and inspection, a problem of an increase in inspection cost or an increase in new contamination risk does not also arise.

2. Since defect inspection of a reflective mask blank can be carried out using as a reference a fiducial mark formed in an absorber film and, in an electron beam writing process in the manufacture of a mask thereafter, it is possible to carry out alignment using the same fiducial mark as described above, the alignment accuracy is improved. Further, since the thickness of the absorber film is thin compared to that of the multilayer reflective film and further the absorber film is a single layer or a laminated film of two or three layers at most, it is possible to shorten the processing time for mark formation and to form a fiducial mark having a cross-sectional shape with high verticality and, therefore, the alignment accuracy is improved.

3. Since etching damage to a glass substrate does not occur in the process of forming the fiducial mark in the absorber film, recycling of the glass substrate is facilitated.

As described before, by obtaining the above-mentioned reflective mask blank formed with the fiducial mark in the absorber film, it is possible, in defect inspection, to determine a reference point for a defect position and to obtain accurate defect information (defect map) including defect position (relative positions between the reference point and a defect) information. Further, in the manufacture of a mask, it is possible to collate pre-designed writing data (mask pattern data) with this defect information and to accurately correct (modify) the writing data so as to reduce the influence due to defects and, as a result, it is possible to reduce defects in a finally manufactured reflective mask.

The reflective mask blank 40 of this invention described above also includes a configuration in which a resist film 51 is formed on the absorber film 41. As described before, such a resist film is used when forming the fiducial marks in the absorber film or the laminated film by photolithography. Further, such a resist film is also used when patterning the absorber film or the laminated film, formed with the fiducial marks, of the reflective mask blank by photolithography.

The reflective mask blank 40 of this invention also includes a configuration in which a hard mask film (also called an etching mask film) is formed between the absorber film 41 and the resist film 51. The hard mask film has a mask function when patterning the absorber film 41 and is made of a material having an etching selectivity different from that of a material of an uppermost layer of the absorber film 41. For example, when the absorber film 41 is made of Ta alone or a material containing Ta, it is possible to use, as the hard mask film, a material such as chromium or a chromium compound, or silicon or a silicon compound. As the chromium compound, there can be cited a material containing Cr and at least one element selected from N, O, C, and H. As the silicon compound, there can be cited a material containing Si and at least one element selected from N, O, C, and H, or a material such as metal silicon (metal silicide) containing silicon and a metal or a metal silicon compound (metal silicide compound) containing a silicon compound and a metal. As the metal silicon compound, there can be cited a material containing a metal, Si, and at least one element selected from N, O, C, and H. When the absorber film 41 is a laminated film of a material containing Ta and a material containing Cr from the multilayer reflective film 31 side, it is possible to select, as a material of the hard mask film, silicon, a silicon compound, a metal silicide, a metal silicide compound, or the like having an etching selectivity different from that of the material containing Cr.

Alternatively, the reflective mask blank 40 of this invention can be configured such that the absorber film is in the form of a laminated film of an uppermost layer and another layer made of materials having etching selectivities different from each other and that the uppermost layer serves as a hard mask film for the other layer.

Figure 13:
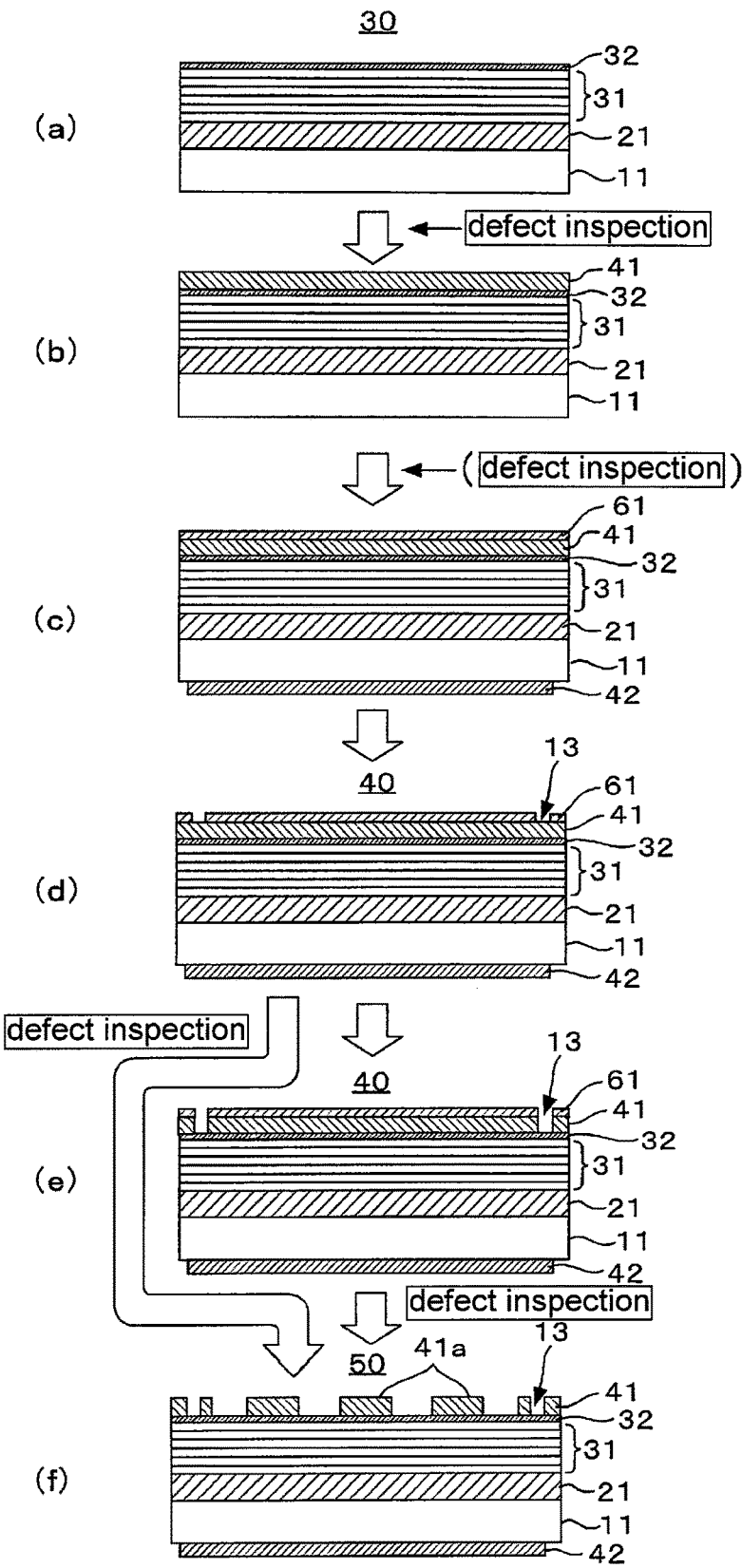
FIG. 13 is cross-sectional views showing another embodiment of manufacturing processes of a reflective mask blank and a reflective mask according to this invention.
Figure 14:
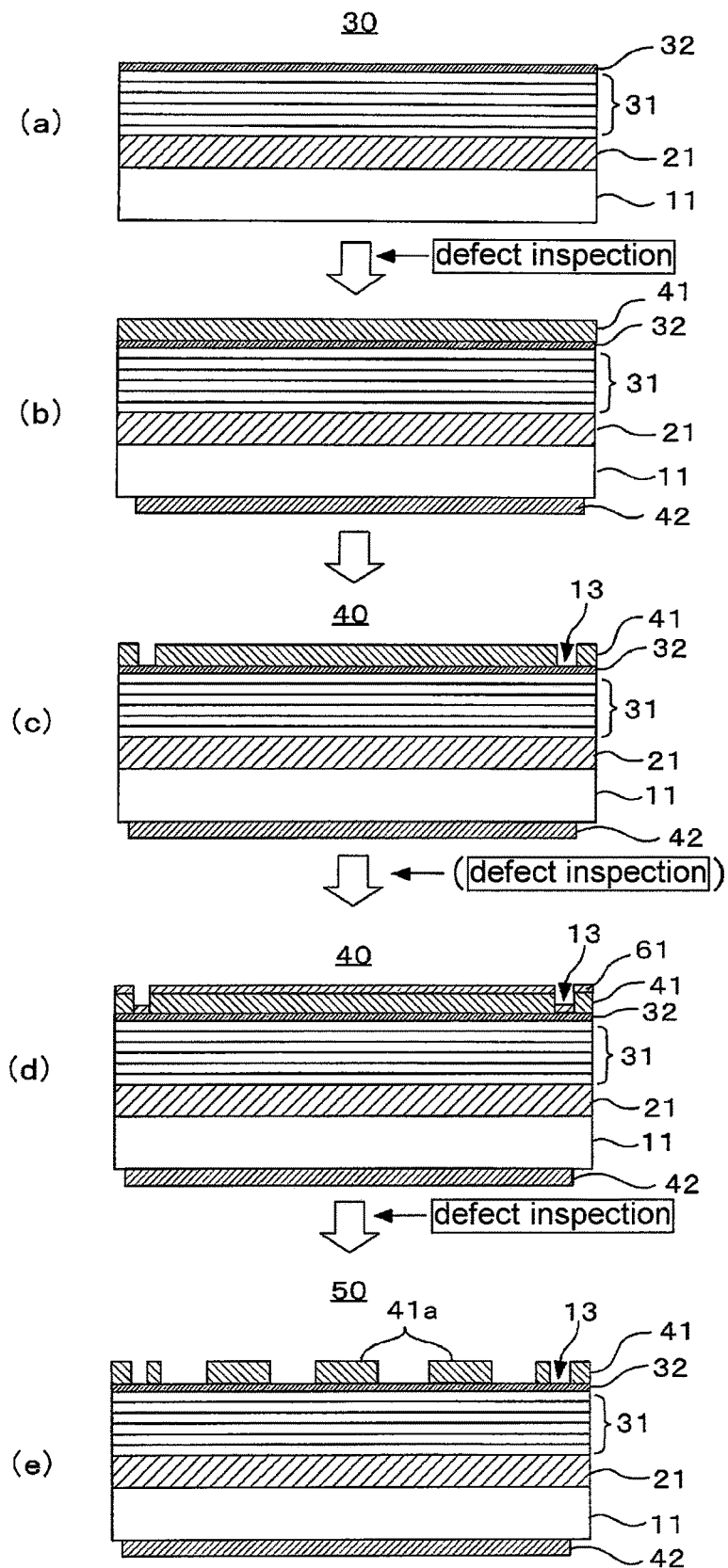
FIG. 14 is cross-sectional views showing another embodiment of manufacturing processes of a reflective mask blank and a reflective mask according to this invention.

FIGS. 13 and 14, respectively, are cross-sectional views showing other embodiments of manufacturing processes of reflective mask blanks and reflective masks according to this invention. The same symbols are assigned to portions equivalent to those in FIG. 10, thereby omitting a duplicate description thereof herein.

In the case of a reflective mask blank 40 formed with a hard mask film on an absorber film 41, the absorber film 41 is formed on a protective film 32 after defect inspection is carried out for a multilayer reflective film formed substrate 30 in the same manner as described above (FIG. 13(b)). Then, a hard mask film 61 is formed on the absorber film 41 after or without carrying out defect inspection of the absorber film 41 (FIG. 13(c)) and then fiducial marks 13 are formed in the hard mask film 61 (FIG. 13(d)). Consequently, there can be provided a reflective mask blank manufacturing method having processes of carrying out defect inspection of the reflective mask blank 40 using the fiducial marks 13 as references.

When carrying out the defect inspection using as references the fiducial marks 13 formed in the hard mask film 61 in the above-mentioned process, if the contrast is not sufficient in detecting the fiducial marks 13, fiducial marks 13 can be formed also in the absorber film 41 located under the hard mask film 61 based on the fiducial marks 13 formed in the hard mask film 61 (FIG. 13(e)), thereby carrying out defect inspection of the reflective mask blank 40 using these fiducial marks 13 as references.

Alternatively, an absorber film 41 is formed on a protective film 32 after defect inspection is carried out for a multilayer reflective film formed substrate 30 in the same manner as described above (FIG. 14(b)), and then fiducial marks 13 are formed in the absorber film 41 (FIG. 14(c)). Then, a hard mask film 61 is formed on the absorber film 41 after or without carrying out defect inspection of the absorber film 41 using the fiducial marks 13 as references (FIG. 14(d)). Thereafter, defect inspection of a reflective mask blank 40 can be carried out using the fiducial marks 13 as references.

In FIGS. 13 and 14, a portion where "defect inspection" is shown in parentheses means "after or without carrying out defect inspection of the absorber film 41" described above.

Also in the embodiment shown in FIG. 13 or 14, entire-surface inspection is carried out as defect inspection of the multilayer reflective film formed substrate 30, while, as described before, it is preferable to carry out partial inspection when carrying out defect inspection of the reflective mask blank 40 using the fiducial marks 13 as references.

[Reflective Mask]

This invention also provides a method of manufacturing a reflective mask in which the absorber film of the reflective mask blank of the above-mentioned structure is patterned.

That is, the absorber film 41 of the reflective mask blank 40 is patterned to form an absorber film pattern 41a, thereby manufacturing a reflective mask 50 (see FIG. 10(d), FIG. 12(d)).

As a method of patterning the absorber film, which is to be a transfer pattern, of the reflective mask blank, the photolithography is the most suitable. When manufacturing a reflective mask using the reflective mask blank of the structure including the etching mask film, the etching mask film may be finally removed, while if remaining of the etching mask film does not affect the function of the reflective mask, removal of the etching mask film is not particularly required.

The reflective mask 50 obtained by patterning the absorber film 41 of the reflective mask blank 40 of the above-mentioned structure is reduced in defects by correcting/modifying writing data based on the defect information of the multilayer reflective film formed substrate 30 or the reflective mask blank 40.

EXAMPLES

Hereinbelow, the embodiments of this invention will be described in further detail with reference to Examples.

Example 1

A $SiO_2$—$TiO_2$-based glass substrate (size: about 152.0 mm×about 152.0 mm, thickness: about 6.35 mm) was prepared, wherein surfaces of the substrate were polished stepwise with cerium oxide abrasive particles and colloidal silica abrasive particles using a double-side polishing machine and then were surface-treated with low-concentration fluorosilicic acid. The surface roughness of the obtained glass substrate was 0.25 nm in root mean square roughness (RMS) (measured by an atomic force microscope, measurement region: 1 μm×1 μm).

The surface shape (surface form, flatness) of both front and back surfaces of the glass substrate was measured by a flatness measuring apparatus (UltraFlat manufactured by Tropel Corporation) (measurement region: 148 mm×148 mm). As a result, the flatness of the front and back surfaces of the glass substrate was about 290 nm.

Then, local surface machining was applied to the surfaces of the glass substrate, thereby adjusting the surface shape thereof.

The surface shape (surface form, flatness) and the surface roughness of the obtained glass substrate surfaces were measured. As a result, in a 142 mm×142 mm measurement region, the flatness of the front and back surfaces was 80 nm, i.e. 100 nm or less, and thus was satisfactory.

Then, using a B-doped Si target and using a mixed gas of Ar gas and He gas as a sputtering gas, DC magnetron sputtering was carried out to form a Si underlayer of 100 nm. Then, stress reduction treatment was carried out by applying thermal energy to the Si film.

Thereafter, in order to maintain the surface shape and to reduce the surface roughness, a surface of the Si underlayer was precision-polished using a single-side polishing machine.

The surface shape (surface form, flatness) and the surface roughness of the obtained Si underlayer surface were measured. As a result, in a 142 mm×142 mm measurement region, the flatness was 80 nm, i.e. 100 nm or less, and thus was satisfactory. Further, in a 1 μm×1 μm measurement region, the surface roughness was 0.08 nm in root mean square roughness RMS and thus was extremely excellent. Since the Si underlayer surface has an extremely high smoothness of 0.1 nm or less in RMS, background noise in a highly sensitive defect inspection apparatus is reduced, which is effective also in terms of suppressing false defect detection.

Further, in a 1 μm×1 μm measurement region, the maximum height (Rmax) was 0.60 nm and thus Rmax/RMS was 7.5. Accordingly, variation in surface roughness was satisfactorily small.

Then, using an ion-beam sputtering apparatus, given that a Si film (thickness: 4.2 nm) and a Mo film (thickness: 2.8 nm) formed one cycle, Si films and Mo films were laminated by 40 cycles on the Si underlayer and finally a Si film (thickness: 4 nm) was formed, and further thereon, a protective film (thickness: 2.5 nm) made of RuNb was formed, thereby obtaining a multilayer reflective film formed substrate.

Then, defect inspection was carried out for a surface of the multilayer reflective film formed substrate by a mask blank defect inspection apparatus (Teron 600 Series manufactured by KLA-Tencor Corporation) using the center of the substrate main surface as a reference. In this defect inspection, convex and concave defect position information using the center of the substrate main surface as a reference and defect size information were obtained, thereby producing a defect map.

The reflectance of the surface of the protective film of the multilayer reflective film formed substrate was evaluated by an EUV reflectometer. As a result, since variation in surface roughness of the underlayer was suppressed, the reflectance was 64%±0.2%, which was satisfactory.

Then, using a DC magnetron sputtering apparatus, an absorber film in the form of a laminated film of a TaBN film (thickness: 56 nm) and a TaBO film (thickness: 14 nm) was formed on the protective film of the multilayer reflective film formed substrate and, further, a CrN conductive film (thickness: 20 nm) was formed on the back side, thereby obtaining an EUV reflective mask blank.

Then, fiducial marks having the following surface shape and concave cross-sectional shape were formed at predetermined portions of a surface of the absorber film. The fiducial marks were formed using a focused ion beam. In this event, conditions were set to an accelerating voltage of 50 kV and a beam current value of 20 pA. Cleaning was carried out after the formation of the fiducial marks.

In this Example, as each fiducial mark, a main mark and auxiliary marks were formed in the arrangement relationship shown in FIG. 2. The main mark 13a had a rectangular shape with a size of 5 µm×5 µm, wherein the depth was set to about 70 nm because the absorber film was fully removed. The auxiliary marks 13b and 13c each had a rectangular shape with a size of 1 µm×200 µm, wherein the depth was set to about 70 nm because the absorber film was fully removed.

The cross-sectional shape of the fiducial mark was observed by an atomic force microscope (AFM). As a result, the inclination angle of a side wall was 87 degrees and the radius of curvature of a ridgeline portion between the surface of the absorber film and the side wall was about 120 nm, meaning that the cross-sectional shape was excellent.

It was confirmed by an electron beam writing apparatus or a mask blank inspection apparatus that the fiducial mark formed in the absorber film exhibited a contrast of as high as 0.020 and thus could be accurately detected and further that it could be detected with high reproducibility because variation in defect detection position was 81 nm.

Defect inspection was carried out for the obtained EUV reflective mask blank by a mask blank defect inspection apparatus (Teron 600 Series manufactured by KLA-Tencor Corporation). In this defect inspection, convex and concave defect position information using the fiducial marks as references and defect size information were obtained.

Herein, the defect inspection data of the multilayer reflective film formed substrate and the defect inspection data of the reflective mask blank were collated with each other based on a plurality of defects which were consistent between defects detected by the defect inspection of the multilayer reflective film formed substrate and defects detected by the defect inspection of the reflective mask blank and coordinate conversion was carried out using as references the fiducial marks formed in the absorber film, thereby obtaining the defect inspection data of the reflective mask blank using as references the fiducial marks formed in the absorber film and defect inspection data of the multilayer reflective film formed substrate using the fiducial marks as references.

In this manner, there was obtained the EUV reflective mask blank with defect information in which the reflective mask blank and these defect position information and defect size information were correlated with each other.

If the above-mentioned defect inspection of the reflective mask blank is carried out for at least part of the defects, detected by the defect inspection of the multilayer reflective film formed substrate, by specifying their positions (partial inspection), the inspection time can be significantly shortened compared to the case where entire-surface inspection is carried out.

Then, using this EUV reflective mask blank with defect information, an EUV reflective mask was manufactured.

First, a resist for electron beam writing was applied on the EUV reflective mask blank by spin coating and then baked, thereby forming a resist film.

Then, the defect information of the EUV reflective mask blank and pre-designed mask pattern data were collated with each other. Then, one of the following corrections was made, i.e. correction to mask pattern data having no influence on pattern transfer using an exposure apparatus, correction to mask pattern data added with correction pattern data so as to, for example, hide a defect under a pattern when judged to have an influence on the pattern transfer, and correction to mask pattern data capable of reducing the load of defect correction after the manufacture of a mask in the case of a defect not curable even by correction pattern data. Based on the corrected mask pattern data, a mask pattern was written on the resist film by an electron beam and then development was carried out, thereby forming a resist pattern. In this Example, since the relative positional relationship between the fiducial marks and defects could be managed with high accuracy, it was possible to accurately correct the mask pattern data.

Using the resist pattern as a mask, the TaBO film of the absorber film was etched with a fluorine-based gas ($CF_4$ gas) and then the TaBN film of the absorber film was etched with a chlorine-based gas ($Cl_2$ gas), thereby forming an absorber film pattern on the protective film.

Then, the resist pattern remaining on the absorber film pattern was removed by hot sulfuric acid, thereby obtaining an EUV reflective mask.

The obtained EUV reflective mask was inspected using a mask defect inspection apparatus (Teron 600 Series manufactured by KLA-Tencor Corporation). As a result, no convex defect was observed on the multilayer reflective film.

When the reflective mask thus obtained is set in an exposure apparatus to carry out pattern transfer onto a semiconductor substrate formed with a resist film, excellent pattern transfer can be carried out with no defect of a transfer pattern due to the reflective mask.

Example 2

A reflective mask blank was manufactured in the same manner as in Example 1 except that fiducial marks in Example 1 were formed by photolithography. The formation positions of the fiducial marks and the surface shape and cross-sectional shape of the fiducial marks were the same as those in Example 1.

That is, on an EUV reflective mask blank formed with an underlayer, a multilayer reflective film, a protective film, and an absorber film on a substrate in the same manner as in Example 1, a resist for electron beam writing was applied by spin coating and then baked, thereby forming a resist film.

Then, patterns of fiducial marks were written on the resist film by an electron beam and then development was carried out, thereby forming a resist pattern.

Using the resist pattern as a mask, dry etching of the absorber film was carried out to form fiducial marks in the absorber film.

The cross-sectional shape of the formed fiducial mark was observed by an atomic force microscope (AFM). As a result, the inclination angle of a side wall was 89 degrees and thus it was possible to form the fiducial mark of the shape with better side wall verticality compared to Example 1 where a focused ion beam was used.

As in Example 1, defect inspection data of the multilayer reflective film formed substrate and defect inspection data of the reflective mask blank were collated with each other based on a plurality of defects which were consistent between defects detected by defect inspection of the multilayer reflective film formed substrate and defects detected by defect inspection of the reflective mask blank and coordinate conversion was carried out using as references the fiducial marks formed in the absorber film, thereby obtaining the defect inspection data of the reflective mask blank using as references the fiducial marks formed in the absorber film and defect inspection data of the multilayer reflective film formed substrate using the fiducial marks as references.

In this manner, there was obtained the EUV reflective mask blank with defect information in which the reflective mask blank and these defect position information and defect size information were correlated with each other.

Then, using this EUV reflective mask blank with defect information, an EUV reflective mask was manufactured in the same manner as in Example 1.

The obtained EUV reflective mask was inspected using a mask defect inspection apparatus (Teron 600 Series manufactured by KLA-Tencor Corporation). As a result, no convex defect was observed on the multilayer reflective film.

When the reflective mask thus obtained is set in an exposure apparatus to carry out pattern transfer onto a semiconductor substrate formed with a resist film, excellent pattern transfer can be carried out with no defect of a transfer pattern due to the reflective mask.

Reference Example

A multilayer reflective film formed substrate and a reflective mask blank were manufactured in the same manner as in Example 1 except that fiducial marks in Example 1 were not formed in an absorber film, but formed in a multilayer reflective film.

In a multilayer reflective film formed substrate formed with an underlayer, a multilayer reflective film, and a protective film on a substrate in the same manner as in Example 1, fiducial marks having the following surface shape and concave cross-sectional shape were formed at predetermined portions of the multilayer reflective film having the protective film. The fiducial marks were formed using a focused ion beam. In this event, conditions were set to an accelerating voltage of 50 kV and a beam current value of 20 pA. Cleaning was carried out after the formation of the fiducial marks.

In this Reference Example, as each fiducial mark, a main mark and auxiliary marks, which were the same as those in Example 1, were formed in the arrangement relationship shown in FIG. 2. The main mark 13a had a rectangular shape with a size of 5 µm×5 µm, wherein the depth was set to about 280 nm because the multilayer reflective film was fully removed. The auxiliary marks 13b and 13c each had a rectangular shape with a size of 1 µm×200 µm, wherein the depth was set to about 280 nm because the multilayer reflective film was fully removed.

The cross-sectional shape of the fiducial mark was observed by an atomic force microscope (AFM). As a result, the inclination angle of a side wall was 85 degrees and thus the side wall verticality was reduced compared to the Examples described above.

It was confirmed by a mask blank inspection apparatus that the fiducial mark formed in the multilayer reflective film exhibited a contrast of as high as 0.025 and thus could be accurately detected and further that it could be detected with high reproducibility because variation in defect detection position was 83 nm.

Defect inspection was carried out for the obtained multilayer reflective film formed substrate by a mask blank defect inspection apparatus (Teron 600 Series manufactured by KLA-Tencor Corporation).

As a result of the defect inspection, a number of defects were detected. Accordingly, cleaning and defect inspection were repeated again. The reason for the detection of a number of defects is considered to be due to the occurrence of a number of foreign matter defects in the process of forming the fiducial marks in the multilayer reflective film.

In this additional defect inspection, convex and concave defect position information using the fiducial marks as references and defect size information were obtained.

The reflectance of a surface of the protective film of the multilayer reflective film formed substrate formed with the fiducial marks was evaluated by an EUV reflectometer. As a result, the reflectance was 62%, which was slightly reduced compared to the reflectance of the surface of the protective film before forming the fiducial marks.

Then, an absorber film, which was the same as that in Example 1, was formed on the multilayer reflective film formed substrate formed with the fiducial marks, thereby obtaining a reflective mask blank.

Defect inspection was carried out for the obtained reflective mask blank by a mask blank defect inspection apparatus (Teron 600 Series manufactured by KLA-Tencor Corporation). In this defect inspection, convex and concave defect position information using the fiducial marks as references and defect size information were obtained.

In this manner, there was obtained the EUV reflective mask blank with defect information in which the reflective mask blank and these defect position information and defect size information were correlated with each other.

Then, using this EUV reflective mask blank with defect information, an EUV reflective mask was manufactured in the same manner as in Example 1.

In a pattern writing process, the defect information of the EUV reflective mask blank and pre-designed mask pattern data were collated with each other. Then, one of the following corrections was made, i.e. correction to mask pattern data having no influence on pattern transfer using an exposure apparatus, correction to mask pattern data added with correction pattern data so as to, for example, hide a defect under a pattern when judged to have an influence on the pattern transfer, and correction to mask pattern data capable of reducing the load of defect correction after the manufacture of a mask in the case of a defect not curable even by correction pattern data. Based on the corrected mask pattern data, a mask pattern was written on a resist film by an electron beam and then development was carried out, thereby forming a resist pattern.

The obtained EUV reflective mask was inspected using a mask defect inspection apparatus (Teron 600 Series manufactured by KLA-Tencor Corporation). As a result, a number of convex defects were observed also on the multilayer reflective film.

The reason for this is presumed that part of the above-mentioned foreign matter defects generated in the process of forming the fiducial marks in the multilayer reflective film were not removed even by the subsequent cleaning and remained on the multilayer reflective film and that, in the electron beam writing process in the manufacture of the mask, since the absorber film was formed on the surface, alignment was carried out using the fiducial marks changed in mark shape, resulting in the influence of alignment error due to the change in mark shape.

Example 3

In this Example, a reflective mask blank was manufactured in which an absorber film in Example 1, 2 was formed as a phase shift film in the form of a laminated film made of different materials.

A multilayer reflective film formed substrate was manufactured in the same manner as in Example 1 and defect inspection was carried out for a surface of the multilayer reflective film formed substrate by a mask blank defect inspection apparatus (Teron 600 Series manufactured by KLA-Tencor Corporation) using the center of the substrate main surface as a reference. In this defect inspection, convex and concave defect position information using the center of the substrate main surface as a reference and defect size information were obtained, thereby producing a defect map.

Then, using a DC magnetron sputtering apparatus, a phase shift film in the form of a laminated film of a TaN film (thickness: 27 nm) and a CrCON film (thickness: 25 nm) was formed on a protective film of the multilayer reflective film formed substrate and, further, a CrN conductive film (thickness: 20 nm) was formed on the back side, thereby obtaining an EUV reflective mask blank.

The refractive index n, the extinction coefficient k, and the thickness of each of the TaN film and the CrCON film constituting the phase shift film formed above were set so that, in a reflective mask, the reflectance of a phase shift film pattern formed on the protective film should be 2% (wavelength: 13.5 nm) and the phase difference between reflected light from the phase shift film pattern and reflected light from an exposed portion of the protective film should be 180 degrees.

Then, fiducial marks were formed in the phase shift film in the form of the laminated film by photolithography as in Example 2. The formation positions of the fiducial marks and the surface shape and cross-sectional shape of the fiducial marks were the same as those in Example 2.

First, a resist for electron beam writing was applied on the EUV reflective mask blank by spin coating and then baked, thereby forming a resist film.

Then, patterns of fiducial marks were written on the resist film by an electron beam and then development was carried out, thereby forming a resist pattern.

Using the resist pattern as a mask, the CrCON film was dry-etched with a mixed gas of $Cl_2$ gas and $O_2$ gas and then the TaN film was dry-etched with a $Cl_2$ gas, thereby forming fiducial marks in the phase shift film.

The cross-sectional shape of the formed fiducial mark was observed by an atomic force microscope (AFM). As a result, the inclination angle of a side wall was 88 degrees and thus it was possible to form the well-shaped fiducial mark.

As in Example 1, the defect inspection data of the multilayer reflective film formed substrate and defect inspection data of the reflective mask blank were collated with each other based on a plurality of defects which were consistent between defects detected by the defect inspection of the multilayer reflective film formed substrate and defects detected by defect inspection of the reflective mask blank using the fiducial marks as references and coordinate conversion was carried out using as references the fiducial marks formed in the phase shift film, thereby obtaining the defect inspection data of the reflective mask blank using as references the fiducial marks formed in the phase shift film and defect inspection data of the multilayer reflective film formed substrate using the fiducial marks as references.

In this manner, there was obtained the EUV reflective mask blank with defect information in which the reflective mask blank and these defect position information and defect size information were correlated with each other.

Then, using this EUV reflective mask blank with defect information, an EUV reflective mask was manufactured in the same manner as in Example 1.

The obtained EUV reflective mask was inspected using a mask defect inspection apparatus (Teron 600 Series manufactured by KLA-Tencor Corporation). As a result, no convex defect was observed on a multilayer reflective film.

When the reflective mask thus obtained is set in an exposure apparatus to carry out pattern transfer onto a semiconductor substrate formed with a resist film, excellent pattern transfer can be carried out with no defect of a transfer pattern due to the reflective mask.

Example 4

A reflective mask blank was manufactured in which a hard mask film was formed on a phase shift film in Example 3.

A multilayer reflective film formed substrate was manufactured in the same manner as in Example 1 and defect inspection was carried out for a surface of the multilayer reflective film formed substrate by a mask blank defect inspection apparatus (Teron 600 Series manufactured by KLA-Tencor Corporation) using the center of the substrate main surface as a reference. In this defect inspection, convex and concave defect position information using the center of the substrate main surface as a reference and defect size information were obtained, thereby producing a defect map.

Then, using a DC magnetron sputtering apparatus, a phase shift film in the form of a laminated film of a TaN film (thickness: 5 nm) and a CrCON film (thickness: 46 nm) was formed on a protective film of the multilayer reflective film formed substrate and, using an RF sputtering apparatus, a $SiO_2$ film (thickness: 5 nm) was formed on the phase shift film. Further, a CrN conductive film (thickness: 20 nm) was formed on the back side, thereby obtaining an EUV reflective mask blank.

The refractive index n, the extinction coefficient k, and the thickness of each of the TaN film and the CrCON film constituting the phase shift film formed above were set so that, in a reflective mask, the reflectance of a phase shift film pattern formed on the protective film should be 26% (wavelength: 13.5 nm) and the phase difference between reflected light from the phase shift film pattern and reflected light from an exposed portion of the protective film should be 180 degrees.

Then, fiducial marks were formed in the phase shift film in the form of the laminated film and the hard mask film at upper portions by photolithography as in Example 3. The formation positions of the fiducial marks and the surface shape and cross-sectional shape of the fiducial marks were the same as those in Example 3.

A resist for electron beam writing was applied on the EUV reflective mask blank by spin coating and then baked, thereby forming a resist film.

Then, patterns of fiducial marks were written on the resist film by an electron beam and then development was carried out, thereby forming a resist pattern.

Using the resist pattern as a mask, the $SiO_2$ film was dry-etched with a $CF_4$ gas, then the CrCON film was dry-etched with a mixed gas of $Cl_2$ gas and $O_2$ gas, and then the TaN film was dry-etched with a $Cl_2$ gas, thereby forming fiducial marks in the hard mask film and the laminated phase shift film.

The cross-sectional shape of the formed fiducial mark was observed by an atomic force microscope (AFM). As a result, the inclination angle of a side wall was 87 degrees and thus it was possible to form the well-shaped fiducial mark.

As in Example 1, the defect inspection data of the multilayer reflective film formed substrate and defect inspection data of the reflective mask blank were collated with each other based on a plurality of defects which were consistent between defects detected by the defect inspection of the multilayer reflective film formed substrate and defects detected by defect inspection of the reflective mask blank and coordinate conversion was carried out using as references the fiducial marks formed in the absorber film, thereby obtaining the defect inspection data of the reflective mask blank using as references the fiducial marks formed in the absorber film and defect inspection data of the multilayer reflective film formed substrate using the fiducial marks as references.

In this manner, there was obtained the EUV reflective mask blank with defect information in which the reflective mask blank and these defect position information and defect size information were correlated with each other.

Then, using this EUV reflective mask blank with defect information, an EUV reflective mask was manufactured in the same manner as in Example 1. The hard mask film in the form of the $SiO_2$ film remaining on a phase shift film pattern was removed by dry etching with a $CF_4$ gas.

The obtained EUV reflective mask was inspected using a mask defect inspection apparatus (Teron 600 Series manufactured by KLA-Tencor Corporation). As a result, no convex defect was observed on a multilayer reflective film.

When the reflective mask thus obtained is set in an exposure apparatus to carry out pattern transfer onto a semiconductor substrate formed with a resist film, excellent pattern transfer can be carried out with no defect of a transfer pattern due to the reflective mask.

In the above-mentioned Examples, the description has been given of the example in which the fiducial mark was formed by a focused ion beam or photolithography, but not limited thereto. As also described before, other than these methods, the fiducial mark can be formed by recess formation by laser light or the like, machining trace by scanning a diamond stylus, indention by a micro-indenter, stamping by an imprint method, or the like.

In the above-mentioned Examples, the description has been given of the example in which the underlayer was formed in each of the multilayer reflective film formed substrate and the reflective mask blank, but not limited thereto. A multilayer reflective film formed substrate or a reflective mask blank formed with no underlayer may also be used.

DESCRIPTION OF SYMBOLS 11 glass substrate
13 fiducial mark
13a main mark
13b, 13c auxiliary mark
21 underlayer
30 multilayer reflective film formed substrate
31 multilayer reflective film
32 protective film
40 reflective mask blank
41 absorber film
50 reflective mask

The invention claimed is:

1. A method of manufacturing a reflective mask blank comprising a multilayer reflective film formed on a substrate so as to reflect EUV light; and a laminated film formed on the multilayer reflective film;
the method comprising:
depositing the multilayer reflective film on the substrate to form a multilayer reflective film formed substrate;
carrying out defect inspection for the multilayer reflective film formed substrate to obtain first defect information of the multilayer reflective film;
depositing the laminated film on the multilayer reflective film of the multilayer reflective film formed substrate;
forming a fiducial mark for an upper portion of the laminated film to thereby form a reflective mask blank comprising the fiducial mark; and
carrying out coordinate conversion of the first defect information of the multilayer reflective film into second defect information of the multilayer reflective film using the fiducial mark as a reference.

2. A method of manufacturing a reflective mask blank comprising a multilayer reflective film formed on a substrate so as to reflect EUV light; and an absorber film formed on the multilayer reflective film so as to absorb the EUV light;
the method comprising:
depositing the multilayer reflective film on the substrate to form a multilayer reflective film formed substrate;
carrying out defect inspection for the multilayer reflective film formed substrate to obtain first defect information of the multilayer reflective film;
depositing the absorber film on the multilayer reflective film of the multilayer reflective film formed substrate;
forming a fiducial mark for the absorber film to thereby form a reflective mask blank comprising the fiducial mark; and
carrying out coordinate conversion of the first defect information of the multilayer reflective film into second defect information of the multilayer reflective film using the fiducial mark as a reference.

3. The method of manufacturing a reflective mask blank according to claim 1, wherein the laminated film comprises an absorber film having a laminated structure.

4. The method of manufacturing a reflective mask blank according to claim 1, wherein the laminated film comprises an absorber film and a hard mask film formed on the absorber film.

5. The method of manufacturing a reflective mask blank according to claim 4, wherein the fiducial mark is formed in the hard mask film.

6. The method of manufacturing a reflective mask blank according to claim 4, wherein the fiducial mark is formed in the absorber film.

7. The method of manufacturing a reflective mask blank according to claim 1, further comprising:
specifying, after the forming the fiducial mark, a formation position where the fiducial mark is formed by a coordinate measuring apparatus;
wherein the second defect information of the multilayer reflective film is provided based on formation position information indicative of the formation position where the fiducial mark is formed.

8. The method of manufacturing a reflective mask blank according to claim 2, further comprising:
specifying, after the forming the fiducial mark, a formation position where the fiducial mark is formed by a coordinate measuring apparatus;

wherein the second defect information of the multilayer reflective film is provided based on formation position information indicative of the formation position where the fiducial mark is formed.

9. A method of manufacturing a reflective mask, comprising:

forming, on a reflective mask blank that is obtained by the method of manufacturing a reflective mask blank according to claim 1, a resist film; and writing a mask pattern on the resist film and carrying out development by collating the second defect information with pre-designed mask pattern data.

10. A method of manufacturing a reflective mask, comprising:

forming, on a reflective mask blank that is obtained by the method of manufacturing a reflective mask blank according to claim 2, a resist film; and writing a mask pattern on the resist film and carrying out development by collating the second defect information with pre-designed mask pattern data.

11. A method of manufacturing a reflective mask, comprising:

obtaining a reflective mask blank by the method of manufacturing a reflective mask blank according to claim 1; and patterning the laminated film of the reflective mask blank, thereby forming a laminated film pattern.

12. A method of manufacturing a reflective mask, comprising:

obtaining a reflective mask blank by the method of manufacturing a reflective mask blank according to claim 2; and patterning the absorber film of the reflective mask blank, thereby forming an absorber film pattern.

* * * * *